United States Patent
Jang et al.

(10) Patent No.: US 10,270,018 B2
(45) Date of Patent: Apr. 23, 2019

(54) LIGHT EMITTING DIODE HAVING SIDE REFLECTION LAYER

(71) Applicant: Seoul Viosys Co., Ltd., Ansan-si (KR)

(72) Inventors: Jong Min Jang, Ansan-si (KR); Chang Youn Kim, Ansan-si (KR); Jae Hee Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/863,971

(22) Filed: Jan. 7, 2018

(65) Prior Publication Data

US 2018/0240950 A1   Aug. 23, 2018

(30) Foreign Application Priority Data

Feb. 17, 2017  (KR) .................. 10-2017-0021633
Feb. 23, 2017  (KR) .................. 10-2017-0024350
Sep. 29, 2017  (KR) .................. 10-2017-0127323

(51) Int. Cl.
*H01L 33/00* (2010.01)
*H01L 33/60* (2010.01)
(Continued)

(52) U.S. Cl.
CPC .............. *H01L 33/60* (2013.01); *H01L 33/20* (2013.01); *H01L 33/46* (2013.01); *H01L 33/505* (2013.01);
(Continued)

(58) Field of Classification Search
CPC ....... H01L 33/60; H01L 33/20; H01L 33/505; H01L 33/54; H01L 33/62
See application file for complete search history.

(56) References Cited

U.S. PATENT DOCUMENTS 5,332,910 A * 7/1994 Haraguchi ............. B82Y 20/00
 257/13
2010/0117111 A1* 5/2010 Illek ...................... H01L 33/382
 257/98
(Continued)

FOREIGN PATENT DOCUMENTS

JP  2016/048718  * 4/2016  ............. H01L 33/46
JP  2016-048718    4/2016

OTHER PUBLICATIONS

European Search Report dated Apr. 17, 2018 in European Patent Application No. 18152671.6.

*Primary Examiner* — Selim U Ahmed
*Assistant Examiner* — Andre Stevenson
(74) *Attorney, Agent, or Firm* — H.C. Park & Associates, PLC

(57) ABSTRACT

Disclosed is a light emitting diode including a side reflection layer. The light emitting diode includes a substrate having a side surface and an upper surface; a semiconductor stack disposed under the substrate and including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad disposed under the ohmic reflection layer and electrically connected to the first conductivity type semiconductor layer; a second bump pad disposed under the ohmic reflection layer and electrically connected to the second conductivity type semiconductor layer; a side reflection layer covering the side surface of the substrate; and a capping layer covering the upper surface of the substrate and the side reflection layer.

20 Claims, 30 Drawing Sheets

(51) Int. Cl.
    *H01L 33/46*     (2010.01)
    *H01L 33/20*     (2010.01)
    *H01L 33/50*     (2010.01)
    *H01L 33/54*     (2010.01)
    *H01L 33/62*     (2010.01)
    *H01L 33/38*     (2010.01)

(52) U.S. Cl.
    CPC .............. *H01L 33/54* (2013.01); *H01L 33/62* (2013.01); *H01L 33/382* (2013.01)

(56) References Cited

U.S. PATENT DOCUMENTS

| | | |
|---|---|---|
| 2015/0129918 A1 | 5/2015 | Ikegami et al. |
| 2015/0187995 A1* | 7/2015 | Yoneda ................ H01L 33/486 257/98 |
| 2015/0303356 A1 | 10/2015 | Sanga et al. |
| 2016/0111600 A1 | 4/2016 | Chae et al. |

\* cited by examiner

LIGHT EMITTING DIODE HAVING SIDE REFLECTION LAYER

CROSS REFERENCE TO RELATED APPLICATIONS

This application claims priority from and the benefit of Korean Patent Application No. 10-2017-0021633, filed on Feb. 17, 2017, Korean Patent Application No. 10-2017-0024350, filed on Feb. 23, 2017, and Korean Patent Application No. 10-2017-0127323, filed on Sep. 29, 2017, all of which are hereby incorporated by reference for all purposes as if fully set forth herein.

BACKGROUND

Field

Exemplary embodiments of the invention relate generally to a light emitting diode and. More specifically, exemplary embodiments relate to a light emitting diode including a side reflection layer to provide a narrow viewing angle.

Discussion of the Background

Recently, with good thermal stability and a direct transition type energy band structure, Group III-based nitrides such as gallium nitride (GaN), aluminum nitride (AlN), and the like have gained attention as materials for light sources in the visible range and the ultraviolet range. Particularly, blue and green light emitting diodes using indium gallium nitride (InGaN) are used in various application fields including large natural color flat displays, signal lamps, interior lighting, high density light sources, camera flashes, high resolution output systems, optical communication, and the like. Furthermore, such light emitting diodes exhibit good linear propagation of light and thus are broadly used in headlamps for automobiles.

Some applications of light emitting diodes often require the light emitting diodes to have a narrow viewing angle. Particularly, light emitting diodes having a narrower viewing angle are more advantageously applicable to automobile headlamps or camera flashes. In addition, when a backlight light source module configured to spread light through a lens is used, such as in LED TVs, it is difficult to discharge light emitted from a side surface of a light emitting diode through the lens, thereby causing an increase in light loss. Therefore, there is a need for a light emitting diode that can reflect light reaching a side surface thereof so as to allow the light to be discharged within the range of narrow viewing angles.

Various techniques of forming a reflection layer on a side surface of a light emitting diode have been studied in order to reflect light traveling towards the side surface thereof.

The side surface of the light emitting diode includes a rough surface formed by scribing and the like and the reflection layer formed on such a rough surface can exhibit relatively low reflectivity. Therefore, there is a need for a technique for improving reflectivity of a side reflection layer formed on the side surface of the light emitting diode including such a rough surface.

Furthermore, formation of a metal layer on a side surface of the light emitting diode can cause problems with surface mount technology (SMT) using solder. Since affinity between the solder and the metal layer is high, the solder can flow to the side surface of the light emitting diode along the metal layer. As a result, the solder is coupled to the metal layer, thereby causing damage to the metal layer. Damage to the metal layer can cause negative optical properties such as deterioration in reflection efficiency, change of light traveling characteristics, and the like.

Moreover, when the side reflection layer is formed on the side surface of the light emitting diode, bonding failure occurs due to the limitations of deposition techniques, thereby causing the side reflection layer to peel off of the light emitting diode. Therefore, there is a need for a technique for maintaining the side reflection layer on the side surface of the light emitting diode.

The above information disclosed in this Background section is only for understanding of the background of the inventive concepts, and, therefore, it may contain information that does not constitute prior art.

SUMMARY

Exemplary embodiments of the invention provide a light emitting diode that has a narrow light viewing angle by reducing the amount of light discharged through a side surface thereof.

Exemplary embodiments provide a light emitting diode that can improve reflectivity of a side reflection layer formed on a side surface of the light emitting diode that includes a rough surface.

Exemplary embodiments provide a light emitting diode that allows surface mounting using a solder while including a side reflection layer.

Exemplary embodiments provide a light emitting diode that can stably maintain a side reflection layer.

An exemplary embodiment of the invention provides a light emitting diode comprising: a substrate having a side surface and an upper surface; a semiconductor stack disposed under the substrate and including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad disposed under the ohmic reflection layer and electrically connected to the first conductivity type semiconductor layer; a second bump disposed under the ohmic reflection layer and electrically connected to the second conductivity type semiconductor layer; a side reflection layer covering the side surface of the substrate; and a capping layer covering the upper surface of the substrate and the side reflection layer.

Exemplary embodiments provide a light emitting diode that includes a side reflection layer to provide a narrow viewing angle by reflecting light traveling towards a side surface of the light emitting diode. Furthermore, the light emitting diode includes a capping layer covering the side reflection layer and an upper surface of a substrate to prevent the side reflection layer from peeling off of the substrate by ensuring structurally stable coupling between the side reflection layer and the substrate.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
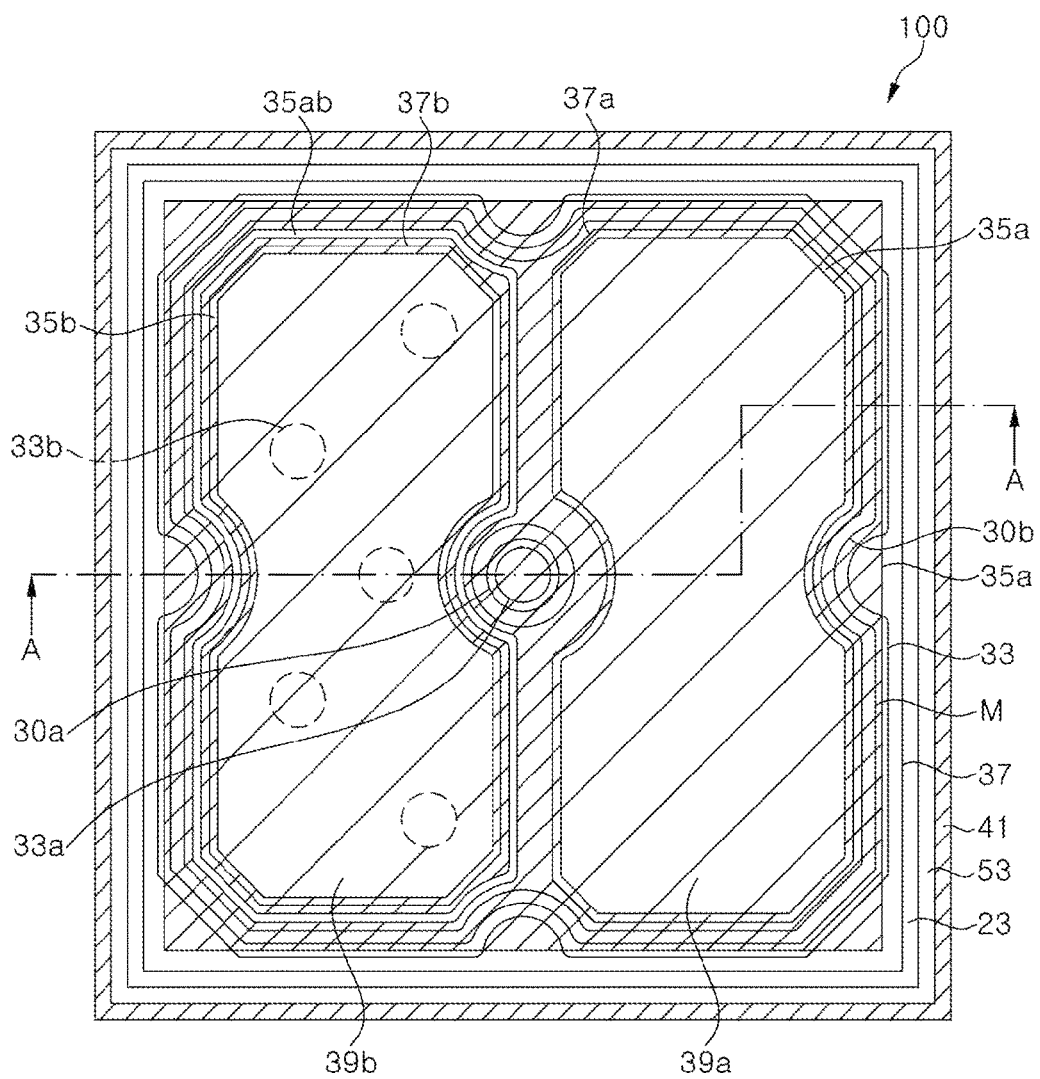
FIG. 1 is a schematic plan view of a light emitting diode according to one exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An exemplary embodiment provides a light emitting diode comprising: a substrate having a side surface and an upper surface; a semiconductor stack disposed under the substrate and including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad disposed under the ohmic reflection layer and electrically connected to the first conductivity type semiconductor layer; a second bump pad disposed under the ohmic reflection layer and electrically connected to the second conductivity type semiconductor layer; a side reflection layer covering the side surface of the substrate; and a capping layer covering the upper surface of the substrate and the side reflection layer.

The side reflection layer serves to reflect light traveling towards the side surface of the substrate, whereby the light emitting diode can have a reduced viewing angle. Furthermore, the capping layer stably couples the side reflection layer to the substrate, thereby securing structural stability of the light emitting diode.

The light emitting diode may further include a light transmitting material layer interposed between the side surface of the substrate and the side reflection layer. The light transmitting material layer interposed between the side surface of the substrate and the side reflection layer can enhance not only adhesion of the side reflection layer but also reflectivity of the side reflection layer.

The substrate may include four side surfaces, and the light transmitting material layer and the side reflection layer may cover the four side surfaces of the substrate. With this structure, the light emitting diode allows most light generated from active layer to be discharged through an upper surface of the substrate.

The light transmitting material layer may include a transparent electrode or an inorganic material layer such as an insulating layer, for example, indium tin oxide (ITO), ZnO, $SiN_x$, SiON or $SiO_2$. An omnidirectional reflector (ODR) may be formed using these material layers.

A lower end of the light transmitting material layer may be flush with a lower end of the side reflection layer.

The side reflection layer may include a reflective metal layer and a barrier layer. The barrier layer protects the reflective metal layer.

In exemplary embodiments, an upper end of the reflective metal layer and an upper end of the barrier layer may be placed outside the upper surface of the substrate. Accordingly, light discharged through the upper surface of the substrate can be discharged to the outside without being reflected by the reflective metal layer.

The upper end of the barrier layer may be placed higher than the upper end of the reflective metal layer.

The side surface of the substrate may include a perpendicular side surface perpendicular with respect to an upper surface of the first conductivity type semiconductor layer and an inclined side surface inclined with respect to the perpendicular side surface. In one exemplary embodiment, the inclined side surface may be farther from the upper surface of the substrate than the perpendicular side surface.

The inclined side surface may have an inclination angle of about 10° or more with respect to the perpendicular side surface.

The inclined side surface may be formed by scribing and the perpendicular side surface may be formed by breaking. The surface formed by breaking may be smoother than the surface formed by scribing. Thus, the inclined side surface is rougher than the perpendicular side surface.

The capping layer may include $SiO_2$, $SiN_x$, SiON, ITO, a primer, or SOG.

The light emitting diode may include a mesa disposed on the first conductivity type semiconductor layer. The mesa may include the active layer and the second conductivity type semiconductor layer, and is separated from the side surface of the substrate. The side reflection layer may be separated from the mesa in a lateral direction.

The light emitting diode may further include: a lower insulation layer covering the ohmic reflection layer, the lower insulation layer including a first opening exposing the first conductivity type semiconductor layer and a second opening exposing the ohmic reflection layer; a first pad metal layer disposed on the lower insulation layer and electrically connected to the first conductivity type semiconductor layer through the first opening; a second pad metal layer disposed on the lower insulation layer and electrically connected to the ohmic reflection layer through the second opening; and an upper insulation layer covering the first pad metal layer and the second pad metal layer, the upper insulation layer including a first opening exposing the first pad metal layer and a second opening exposing the second pad metal layer, wherein the first bump pad is disposed on and is electrically connected to the first pad metal layer through the first opening of the upper insulation layer, wherein the second bump pad is disposed on and electrically connected to the second pad metal layer through the second opening of the upper insulation layer.

The mesa may include a through-hole formed through the second conductivity type semiconductor layer and the active layer to expose the first conductivity type semiconductor layer, and the first pad metal layer may be electrically connected to the first conductivity type semiconductor layer exposed through the through-hole.

The mesa may further include an indented portion formed on side surfaces of the mesa in plan view to expose the first conductivity type semiconductor layer, and the first pad metal layer may be electrically connected to the first conductivity type semiconductor layer exposed through the indented portion.

The mesa may have corners each having a cut shape and the first pad metal layer may be electrically connected to the first conductivity type semiconductor layer at the corners of the mesa in plan view.

The light emitting diode may further include an ohmic oxide layer disposed around the ohmic reflection layer and forming ohmic contact with the second conductivity type semiconductor layer. The ohmic oxide layer can reduce contact resistance, thereby reducing forward voltage of the light emitting diode.

The light emitting diode may further include a wavelength converter disposed on the substrate. The wavelength converter may include a wavelength converting sheet or a ceramic plate phosphor. Particularly, the ceramic plate phosphor exhibits high heat resistance and can be used without discoloration for a long period of time even under high temperature conditions.

The wavelength converter may be bonded to the capping layer via a bonding agent.

Exemplary embodiments will be described in more detail with reference to the accompanying drawings.

Figure 2:
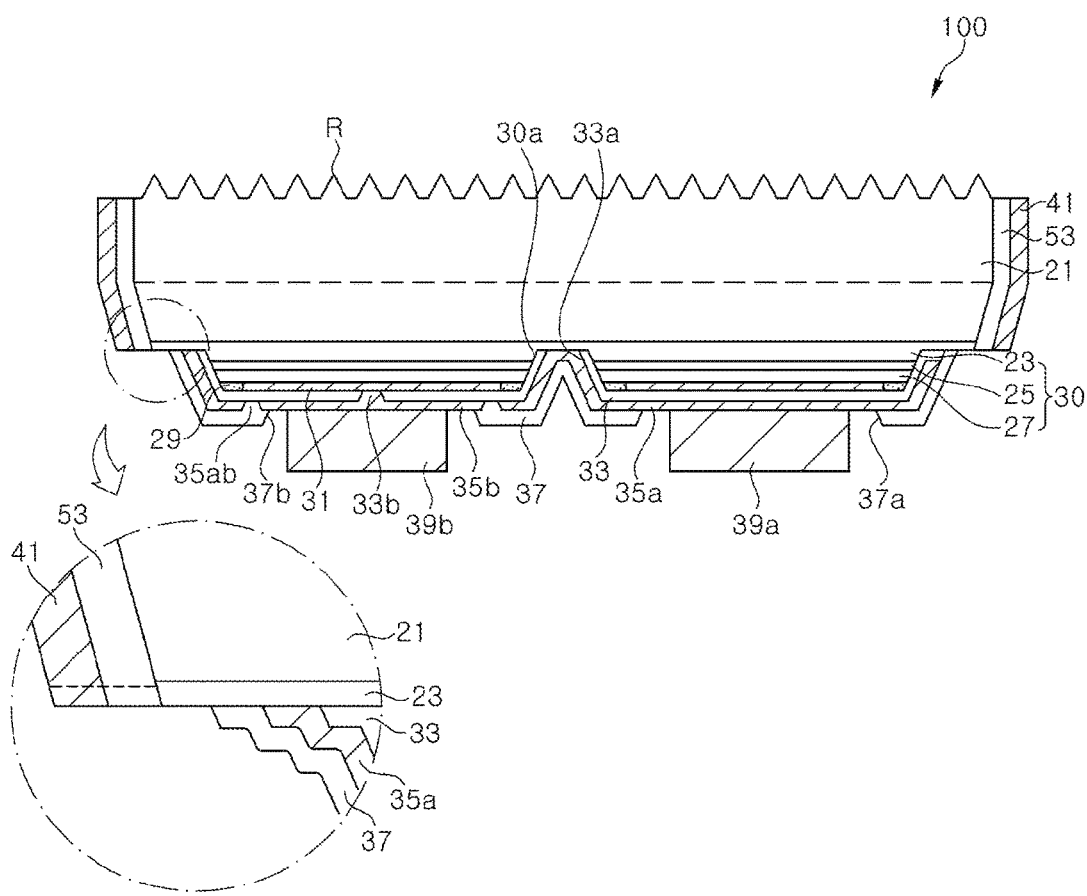
FIG. 2 is a cross-sectional view taken along line A-A of FIG. 1.
Figure 3:
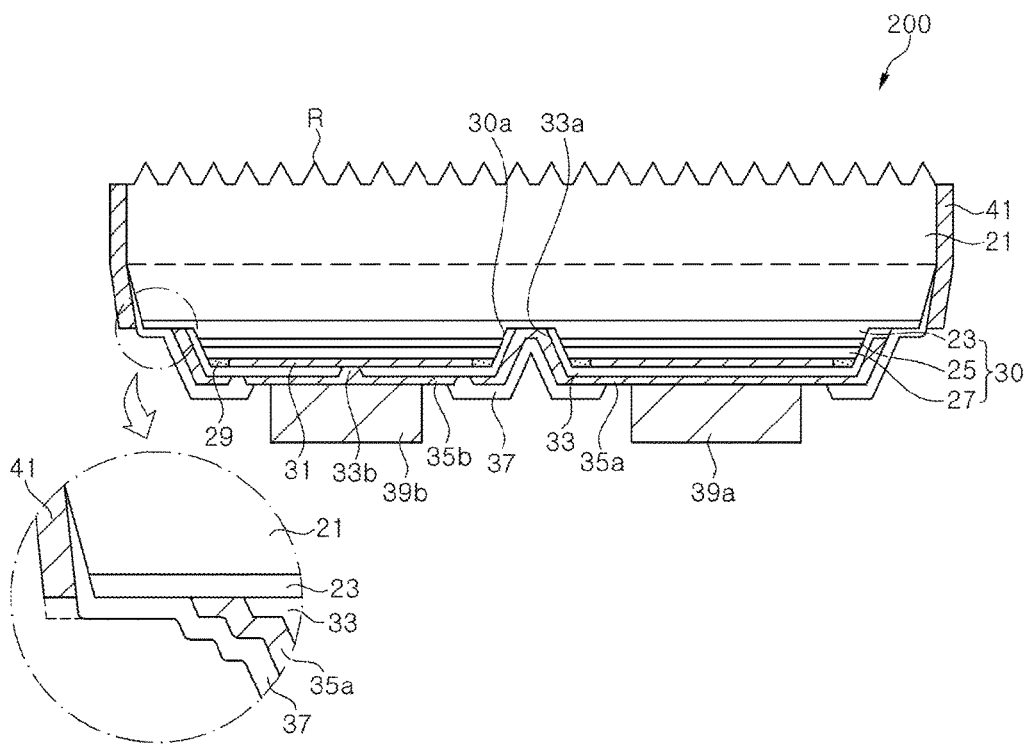
FIG. 3 is a schematic cross-sectional view of a light emitting diode according to another exemplary embodiment.

FIG. 1 and FIG. 2 are a schematic plan view of a light emitting diode 100 according to one exemplary embodiment. FIG. 3 is a cross-sectional view taken along line A-A of FIG. 1.

Referring to FIG. 1 and FIG. 2, the light emitting diode 100 according to the exemplary embodiment includes a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, an upper insulation layer 37, a first bump pad 39a, a second bump pad 39b, a roughness relieving layer (or light transmitting material layer) 53, and a side reflection layer 41. The first conductivity type semiconductor layer 23, the active layer 25 and the second conductivity type semiconductor layer 27 constitute a semiconductor stack 30. The light emitting diode may further include an ohmic oxide layer 29.

The substrate 21 is a substrate that allows growth of gallium nitride-based semiconductor layers thereon, and may be, for example, a sapphire substrate or a gallium nitride-based substrate. The sapphire substrate may be used in growth of gallium nitride-based semiconductor layers at relatively low cost. The gallium nitride-based substrate has the same or similar index of refraction to the index of refraction of the first conductivity type semiconductor layer 23. Thus, light emitted from the active layer 25 can enter the substrate 21 without suffering from significant variation in refraction, thereby improving luminous efficacy. The substrate 21 has a roughness R formed on an upper surface thereof such that light can be discharged through the roughness of the substrate. Accordingly, the light emitting diode can have improved efficiency in extraction of light. However, it should be understood that other implementations are also possible. Alternatively, the roughness R can be omitted and the substrate 21 may be a flat surface.

A light viewing angle of the light emitting diode is decreased with increasing distance from the active layer 25 to the upper surface of the substrate 21. This distance is 50 μm or more, for example, 500 μm or less, specifically 300 μm or less, without being limited thereto. The substrate 21 may have various sizes, without being limited to a particular size.

Although the substrate 21 is a growth substrate in this exemplary embodiment, it should be understood that other implementations are also possible. Alternatively, the substrate may be a relatively thick gallium nitride-based semiconductor layer grown on a separate growth substrate. Alternatively, a continuous layer of the first conductivity type semiconductor layer 23 may be used instead of the substrate. The separate growth substrate can be removed.

The substrate 21 may include a perpendicular side surface perpendicular to a lower surface of the substrate 21 and an inclined side surface inclined with respect to the perpendicular side surface. The perpendicular side surface may be placed more adjacent the upper surface of the substrate 21 than the inclined side surface. An angle defined between the perpendicular side surface and the inclined side surface may be about 10 degrees or more. An inclination angle of the perpendicular side surface may be determined by scribing.

Laser scribing provides a steeper inclination angle than blade scribing. The inclined side surface formed by scribing may be rougher than the perpendicular side surface formed by breaking. A boundary between the perpendicular side surface and the inclined side surface is indicated by a dotted line. The perpendicular side surface and the inclined side surface may be formed on all four side surfaces of the substrate 21.

The first conductivity type semiconductor layer 23 may be disposed on the substrate 21. Particularly, the first conductivity type semiconductor layer 23 is disposed near the inclined side surface of the substrate 21. The first conductivity type semiconductor layer 23 may be a layer grown on the substrate 21 or a gallium nitride-based semiconductor layer. The first conductivity type semiconductor layer 23 may be a gallium nitride-based semiconductor layer doped with n-type dopants, for example, Si. Here, although the first conductivity type semiconductor layer 23 is illustrated as being clearly differentiated from the substrate 21, the boundary between the first conductivity type semiconductor layer 23 and the substrate 21 may be unclear. Particularly, when the first conductivity type semiconductor layer 23 and the substrate 21 are formed of the same material, it can be difficult to clearly distinguish the boundary therebetween. As shown in the drawings, part of the inclined side surface may include the first conductivity type semiconductor layer 23.

A mesa M is disposed on the first conductivity type semiconductor layer 23. The mesa M may be disposed only inside a region surrounded by the first conductivity type semiconductor layer 23 such that regions near edges of the first conductivity type semiconductor layer can be exposed to the outside instead of being covered by the mesa M.

The mesa M may include the second conductivity type semiconductor layer 27 and the active layer 25. In addition, the mesa M may include a portion of the first conductivity type semiconductor layer 23 in a thickness direction thereof. The active layer 25 is interposed between the first conductivity type semiconductor layer 23 and the second conductivity type semiconductor layer 27. The active layer 25 may have a single quantum well structure or a multi-quantum well structure. The composition and thickness of well layers in the active layer 25 determine wavelengths of light generated from the active layer. Particularly, it is possible to provide an active layer generating UV light, blue light or green light through adjustment of the composition of the well layers.

The second conductivity type semiconductor layer 27 may be a gallium nitride-based semiconductor layer doped with p-type dopants, for example, Mg. Each of the first conductivity type semiconductor layer 23 and the second conductivity type semiconductor layer 27 may be composed of a single layer or multiple layers and may include super lattice layers, without being limited thereto. The first conductivity type semiconductor layer 23, the active layer 25 and the second conductivity type semiconductor layer 27 may be grown on the substrate 21 within a chamber by any well-known method, such as metal organic chemical vapor deposition (MOCVD) or molecular beam epitaxy (MBE).

The mesa M may have an inclined side surface so as to have a gradually narrowing area with increasing distance from the first conductivity type semiconductor layer 23. The mesa M may have a gentler inclination than the inclined side surface of the substrate 21. However, it should be understood that other implementations are also possible. Alternatively, the inclined side surface of the substrate 21 may have a gentler inclination than the side surface of the mesa M.

The mesa M may include a through-hole 30a formed through the second conductivity type semiconductor layer 27 and the active layer 25 to expose the first conductivity type semiconductor layer 23. The through-hole 30a is surrounded by the second conductivity type semiconductor layer 27 and the active layer 25. The mesa M may have a substantially rectangular shape with cut corners. The mesa M may further include an indented portion 30b exposing the first conductivity type semiconductor layer 23. The indented portion 30b is partially surrounded by the second conductivity type semiconductor layer 27 and the active layer 25. The indented portion 30b may be formed on all four side surfaces of the mesa M, without being limited thereto. Alternatively, the indented portion may be restrictively formed on one to three side surfaces of the mesa. Sidewalls of the through-hole 30a and the indented portion 30b may be inclined like the side surface of the mesa M. The sidewalls of the through-hole and the indented portion may have a gentler inclination than the inclined side surface of the substrate 21.

The ohmic reflection layer 31 is disposed on the mesa M to contact the second conductivity type semiconductor layer 27. The ohmic reflection layer 31 may be disposed over the entire region of an upper surface of the mesa M. For example, the ohmic reflection layer 31 may cover 80% or more, specifically 90% or more, of the upper surface of the mesa M.

The ohmic reflection layer 31 may include a reflective metal layer and thus can reflect light, which is generated in the active layer 25 and reaches the ohmic reflection layer 31, towards the substrate 21. For example, the ohmic reflection layer 31 may be composed of a single reflective metal layer, without being limited thereto. In some exemplary embodiments, the ohmic reflection layer 31 may include an ohmic layer and a reflective layer. The ohmic layer may be a metal layer such as a Ni layer and the reflective layer may be a metal layer having high reflectivity such as an Ag or Al layer. The ohmic reflection layer 31 may further include barrier layers, for example, Ni, Ti, and Au layers. For example, the ohmic reflection layer may have a stack structure of Ni/Ag/Ni/Ti/Ni/Ti/Au/Ti.

In this exemplary embodiment, the ohmic reflection layer 31 is a multilayer structure of metal layers. However, it should be understood that other implementations are also possible. For example, the ohmic layer may be a transparent oxide layer such as ITO or ZnO, and the reflective layer such as an Ag or Al layer may be formed on the ohmic layer. In addition, the ohmic reflection layer 31 may further include a dielectric layer such as a $SiO_2$ layer between the transparent oxide layer and the reflective layer. Here, the dielectric layer provides a passage through which the transparent oxide layer is electrically connected to the reflective layer. With the dielectric layer such as the $SiO_2$ layer interposed between the transparent oxide layer and the reflective layer, the ohmic reflection layer can have further improved reflectivity.

The ohmic oxide layer 29 may cover the mesa M around the ohmic reflection layer 31. The ohmic oxide layer 29 may be formed of a transparent oxide layer, for example, indium tin oxide (ITO) or ZnO. A side surface of the ohmic oxide layer 29 may be substantially flush with the side surface of the mesa M. With the ohmic oxide layer 29 disposed around the ohmic reflection layer 31, the light emitting diode can have an enlarged ohmic contact area, thereby reducing forward voltage of the light emitting diode.

The lower insulation layer 33 covers the mesa M, the ohmic oxide layer 29 and the ohmic reflection layer 31. The lower insulation layer 33 may cover the side surface of the mesa M along the periphery of the mesa M and may also cover a portion of the first conductivity type semiconductor layer 23 exposed along the periphery of the mesa M. The lower insulation layer 33 covers the sidewall of the through-hole 30a inside the through-hole 30a and also covers the sidewall of the indented portion 30b.

The lower insulation layer 33 has a first opening 33a which exposes the first conductivity type semiconductor layer 23, and a second opening 33b which exposes the ohmic reflection layer 31. The first opening 33a may be disposed in each of the through-hole 30a and the indented portion 30b. In addition, the lower insulation layer 33 may expose the first conductivity type semiconductor layer 23 along the periphery of the mesa M.

The second opening 33b of the lower insulation layer 33 exposes the ohmic reflection layer 31. The lower insulation layer 33 may include a plurality of second openings 33b, which may be disposed near one side of the mesa M.

The lower insulation layer 33 may be composed of a single layer of $SiO_2$ or $Si_3N_4$, without being limited thereto. Alternatively, the lower insulation layer 33 may have a multilayer structure including, for example, a silicon nitride layer and a silicon oxide layer, or may include a distributed Bragg reflector in which dielectric layers having different indexes of refraction such as a silicon oxide layer and a titanium oxide layer are alternately stacked one above another.

The first pad metal layer 35a is disposed on the lower insulation layer 33 and is insulated from the mesa M and the ohmic reflection layer 31 by the lower insulation layer 33. The first pad metal layer 35a contacts the first conductivity type semiconductor layer 23 through the first openings 33a of the lower insulation layer 33. The first pad metal layer 35a may include an outer contact portion contacting the first conductivity type semiconductor layer 23 around the mesa M and an inner contact portion contacting the first conductivity type semiconductor layer 23 inside the through-hole 30a. The outer contact portion of the first pad metal layer 35a may be formed near the indented portion 30b formed on the periphery of the mesa M and may also be formed near four corners of the mesa M. At least one of the inner and outer contact portions may be used and use of both the inner contact portion and the outer contact portion can enhance current spreading performance of the light emitting diode.

The second pad metal layer 35b is disposed on the lower insulation layer 33 to be placed above the mesa M and is electrically connected to the ohmic reflection layer 31 through the second openings 33b of the lower insulation layer 33. The second pad metal layer 35b may be surrounded by the first pad metal layer 35a and a boundary region 35ab may be formed therebetween. The lower insulation layer 33 is exposed to the boundary region 35ab, which is covered by the upper insulation layer 37 described below.

The first pad metal layer 35a and the second pad metal layer 35b may be formed of the same material by the same process. Each of the first and second pad metal layers 35a, 35b may include an ohmic reflection layer such as an Al layer, which may be formed on a bonding layer such as a Ti, Cr or Ni layer. In addition, a protective layer composed of a single layer or a composite layer including Ni, Cr, Au and the like may be formed on the ohmic reflection layer. The first and second pad metal layers 35a, 35b may have a multilayer structure of, for example, Cr/Al/Ni/Ti/Ni/Ti/Au/Ti.

The upper insulation layer 37 covers the first and second pad metal layers 35a, 35b. In addition, the upper insulation layer 37 may cover the first conductivity type semiconductor layer 23 along the periphery of the mesa M. Here, the upper insulation layer 37 may expose the first conductivity type semiconductor layer 23 along an edge of the substrate 21.

The upper insulation layer 37 includes a first opening 37a which exposes the first pad metal layer 35a and a second opening 37b which exposes the second pad metal layer 35b. The first opening 37a and the second opening 37b may be disposed above the mesa M so as to face each other. Particularly, the second opening 37b may be disposed only in an upper region of the second pad metal layer 35b.

Although the second opening 37b is illustrated as completely exposing upper regions of the second openings 33b of the lower insulation layer 33 in this exemplary embodiment, the second opening 37b of the upper insulation layer may be separated from the second openings 33b of the lower insulation layer 33 in the lateral direction. That is, the second openings 33b may be disposed outside the second opening 37b and a plurality of second openings 37b may be separated from the second openings 33b in the lateral direction.

The upper insulation layer 37 may be composed of a single layer of $SiO_2$ or $Si_3N_4$, without being limited thereto. Alternatively, the upper insulation layer 37 may have a multilayer structure including, for example, a silicon nitride layer and a silicon oxide layer, or may include a distributed Bragg reflector in which dielectric layers having different indexes of refraction such as a silicon oxide layer and a titanium oxide layer are alternately stacked one above another.

The first bump pad 39a electrically contacts the first pad metal layer 35a exposed through the first opening 37a of the upper insulation layer 37, and the second bump pad 39b electrically contacts the second pad metal layer 35b exposed through the second opening 37b. As shown in FIG. 1 and FIG. 2, the first bump pad 39a and the second bump pad 39b may be disposed only in the first opening 37a and the second opening 37b, respectively, without being limited thereto. Alternatively, the first and second bump pads 39a, 39b may cover the first and second openings 37a, 37b to seal the first and second openings 37a, 37b, respectively.

The first bump pad 39a is electrically connected to the first conductivity type semiconductor layer 23 through the first pad metal layer 35a, and the second bump pad 39b is electrically connected to the second conductivity type semiconductor layer 27 through the second pad metal layer 35b and the ohmic reflection layer 31. The second pad metal layer 35b may be omitted and the second bump pad 39b may be directly connected to the ohmic reflection layer 31.

As shown in FIG. 1, the second bump pad 39b may be placed only in an upper region of the second pad metal layer 35b, without being limited thereto. Alternatively, the second bump pad 39b may partially overlap the first pad metal layer 35a. In this exemplary embodiment, the upper insulation layer 37 is disposed between the first pad metal layer 35a and the second bump pad 39b to insulate the first pad metal layer 35a from the second bump pad 39b.

On the other hand, the side reflection layer 41 may be disposed on the side surfaces of the substrate 21. The side reflection layer 41 covers not only the perpendicular side surface of the substrate 21 but also the inclined side surface thereof. The side reflection layer 41 may also cover the side surface of the first conductivity type semiconductor layer 23.

Although the side reflection layer 41 may be formed to cover all four side surfaces of the substrate 21, other implementations are also possible. Alternatively, the side reflection layer 41 may be formed to cover one to three side surfaces of the substrate 21.

The side reflection layer 41 is separated from the mesa M in the lateral direction. As shown in an enlarged circle of FIG. 2, the side reflection layer 41 is separated from the first pad metal layer 35a in the lateral direction. Particularly, the side reflection layer 41 may be disposed above the upper surface of the mesa M and thus is placed above the exposed surface of the first conductivity type semiconductor layer 23 around the mesa M. For example, a lower end of the side reflection layer 41 may be flush with the exposed surface of the first conductivity type semiconductor layer 23, or may be placed above the exposed surface of the first conductivity type semiconductor layer 23, as indicated by a dotted line. Accordingly, a portion of the exposed surface of the first conductivity type semiconductor layer 23 around the mesa M may be exposed to the outside between the side reflection layer 41 and the upper insulation layer 37.

The side reflection layer 41 may include a metal reflection layer of Ag or Al and a barrier layer such as Ni and/or Ti may be disposed on the metal reflection layer. Further, an anti-oxidation layer such as an Au layer may be disposed on the barrier layer in order to prevent oxidation of the metal reflection layer. Further, the barrier layer may include Ni and Mo. Furthermore, a bonding layer such as a Ni layer or a Ti layer may be interposed between the metal reflection layer and the substrate 21 in order to improve bonding characteristics of the metal reflection layer. For example, the side reflection layer 41 may have a multilayer structure of (Ni)/Ag/Ni/Ti/Au, (Ni)/Ag/Ni/Mo/Ni/Mo, or (Ni)/Ag/Ni/Mo/Ag/SiO$_2$. Furthermore, the side reflection layer 41 is not limited to the metal reflection layer, and may further include a distributed Bragg reflector (DBR) or an omnidirectional reflector (ODR).

With the side reflection layer 41 disposed only on the side surfaces of the substrate 21 and the first conductivity type semiconductor layer 23, the side reflection layer 41 can be prevented from directly contacting (short circuiting) the first pad metal layer 35a, thereby preventing electrical interference by the side reflection layer 41.

When the side reflection layer 41 includes the metal reflection layer overlapping the first pad metal layer 35a, the side reflection layer 41 can be directly electrically connected to the first pad metal layer 35a through defects such as pin holes or cracks in the upper insulation layer 37. In this case, electrical characteristics of the light emitting diode, such as forward voltage, can be significantly changed depending upon the presence of contact between the side reflection layer 41 and the first pad metal layer 35a, thereby causing significant deviation in electrical characteristics between light emitting diodes. On the contrary, according to this exemplary embodiment, the side reflection layer 41 is separated from the first pad metal layer 35a, thereby enabling mass production of light emitting diodes with less deviation in electrical characteristics.

The roughness relieving layer 53 is interposed between the side surface of the substrate 21 and the side reflection layer 41. The roughness relieving layer 53 may cover both the perpendicular side surface and the inclined side surface of the substrate 21. In addition, the roughness relieving layer 53 may be separated from the mesa M in the lateral direction, like the side reflection layer 41. The roughness relieving layer 53 may cover a region substantially similar to the side reflection layer 41, and may be placed only on the side surface of the substrate 21 so as to expose the upper and lower surfaces of the substrate 21.

In this exemplary embodiment, the roughness relieving layer 53 may be separated from the upper insulation layer 37 and the lower insulation layer 33.

The roughness relieving layer 53 may be formed of a transparent oxide layer such as an ITO layer or a SiO$_2$ layer, or a nitride layer. The roughness relieving layer 53 may be formed to have a surface roughness Ra of 2 nm or less. The roughness relieving layer 53 may also act as a bonding layer for improving bonding strength of the side reflection layer 41.

When a sapphire substrate is subjected to grinding, a rough surface having too high roughness to be measured can be formed on the sapphire substrate. For the structure wherein the metal reflection layer was formed on the rough surface, it could be seen that the metal reflection layer had a reflectivity of about 50% with respect to light having a wavelength of 450 nm and supplied from a side of the sapphire substrate. However, when a SiO$_2$ layer was formed on the rough layer before formation of the metal reflection layer so as to have a surface roughness Ra of about 2 nm, it could be seen that the reflectivity of the metal reflection layer was increased to about 70%.

That is, the roughness relieving layer such as an ITO layer or a SiO$_2$ layer may be formed on the rough surface of the substrate in order to improve reflectivity of the metal reflection layer formed thereon.

Furthermore, a roughness relieving layer 53, which may be transparent, may be interposed between the side reflection layer 41 and the substrate 21 to form an omnidirectional reflector (ODR).

FIG. 3 is a schematic cross-sectional view of a light emitting diode 200 according to another exemplary embodiment.

Referring to FIG. 3, the light emitting diode 200 according to this exemplary embodiment is generally similar to the light emitting diode 100 described with reference to FIG. 1 and FIG. 2 except that the upper insulation layer 37 covers the inclined side surface of the substrate 21 to act as a roughness relieving layer.

That is, the upper insulation layer 37 covers the entirety of the first conductivity type semiconductor layer 23 exposed around the mesa M, and also covers the side surface of the first conductivity type semiconductor layer 23 and the inclined side surface of the substrate 21. Here, the upper insulation layer 37 does not cover the perpendicular side surface of the substrate 21.

On the other hand, the side reflection layer 41 may directly contact the perpendicular side surface of the substrate 21 and also covers the upper insulation layer 37 on the inclined side surface. In this structure, the lower end of the side reflection layer 41 may be flush with the exposed surface of the first conductivity type semiconductor layer 23, or may be disposed below the exposed surface of the first conductivity type semiconductor layer 23, as indicated by a dotted line. Here, the lower end of the side reflection layer 41 may be flush with or disposed above a horizontal plane of the upper insulation layer 37.

Figure 4:
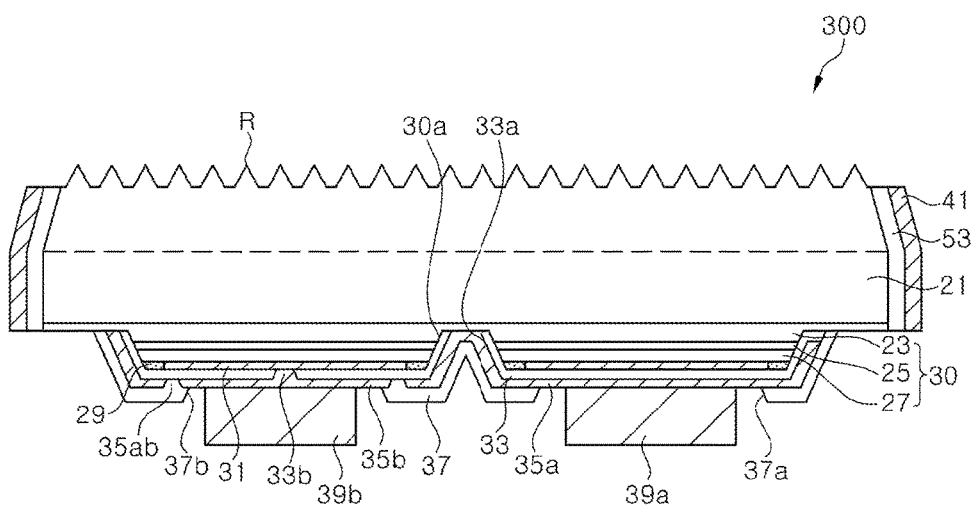
FIG. 4 is a schematic cross-sectional view of a light emitting diode according to a further exemplary embodiment.

FIG. 4 is a schematic cross-sectional view of a light emitting diode 300 according to another exemplary embodiment.

Referring to FIG. 4, the light emitting diode 300 according to this exemplary embodiment is generally similar to the light emitting diode 100 described with reference to FIG. 1 and FIG. 2 except that the inclined side surface of the light emitting diode 300 is placed closer to the upper surface of the substrate than the perpendicular side surface thereof. The inclined side surface of the substrate may be placed adjacent the upper surface of the substrate 21, and the perpendicular side surface thereof may be placed adjacent the first conductivity type semiconductor layer 23.

The perpendicular side surface and the inclined side surface may be covered by the side reflection layer 41, and the roughness relieving layer 53 is interposed between the side surface of the substrate 21 and the side reflection layer 41.

Since the inclined side surface is placed adjacent the upper surface of the substrate 21, the light emitting diode 300 according to this exemplary embodiment may have a narrower viewing angle than the light emitting diode 100 shown in FIG. 1 and FIG. 2.

Figure 5:
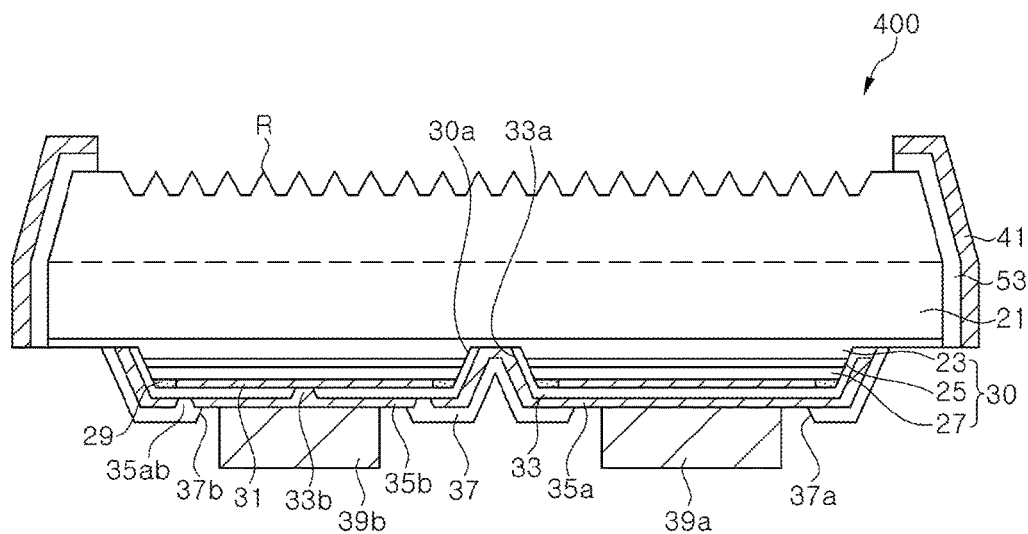
FIG. 5 is a schematic cross-sectional view of a light emitting diode according to yet another exemplary embodiment.

FIG. 5 is a schematic cross-sectional view of a light emitting diode 400 according to yet another exemplary embodiment.

Referring to FIG. 5, the light emitting diode 400 according to this exemplary embodiment is generally similar to the light emitting diode 300 described with reference to FIG. 4 except that the side reflection layer 41 and the roughness relieving layer 53 partially cover the upper surface of the substrate 21. That is, the side reflection layer 41 extends to the upper surface of the substrate 21 to cover the upper surface of the substrate 21 along an edge of the upper surface of the substrate 21. The roughness relieving layer 53 also extends to the upper surface of the substrate 21 to be interposed between the side reflection layer 41 and the upper surface of the substrate. In this exemplary embodiment, the roughness relieving layer 53 is partially formed on the upper surface of the substrate 21.

With the structure wherein the side reflection layer 41 covers the edge of the upper surface of the substrate 21, the light emitting diode 400 according to this exemplary embodiment may have a narrower viewing angle than the light emitting diode 300.

Figure 6:
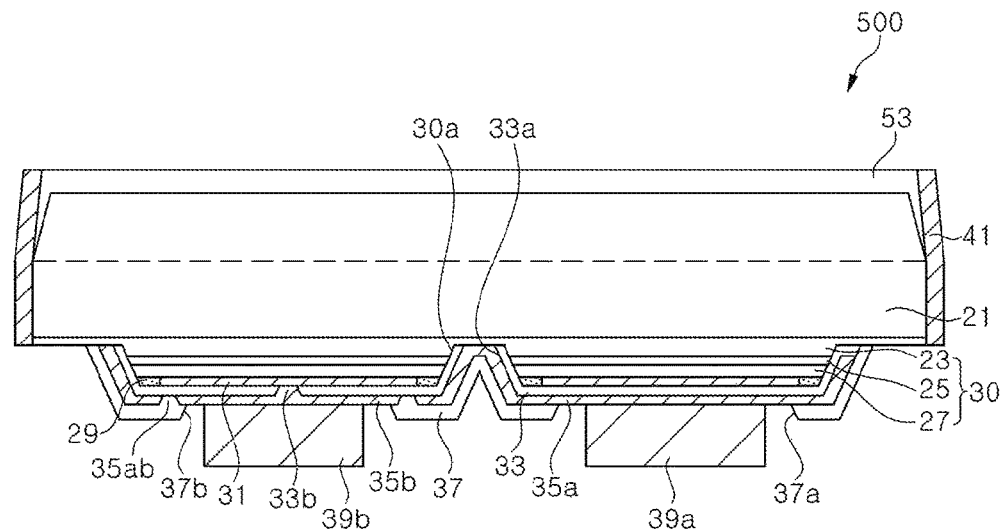
FIG. 6 is a schematic cross-sectional view of a light emitting diode according to yet another exemplary embodiment.

FIG. 6 is a schematic cross-sectional view of a light emitting diode 500 according to yet another exemplary embodiment.

Referring to FIG. 6, the light emitting diode 500 according to this exemplary embodiment is generally similar to the light emitting diode 400 described with reference to FIG. 5 except for the location of the roughness relieving layer 53.

Specifically, according to this exemplary embodiment, the roughness relieving layer 53 covers the inclined side surface of the substrate 21 without covering the perpendicular side surface thereof. In addition, the roughness relieving layer 53 may cover the entirety of the upper surface of the substrate 21. The side reflection layer 41 may be disposed to directly contact the perpendicular side surface and cover the roughness relieving layer 53 on the inclined side surface.

In this exemplary embodiment, the roughness R on the upper surface of the substrate 21 may be omitted, but is not limited thereto.

Figure 7:
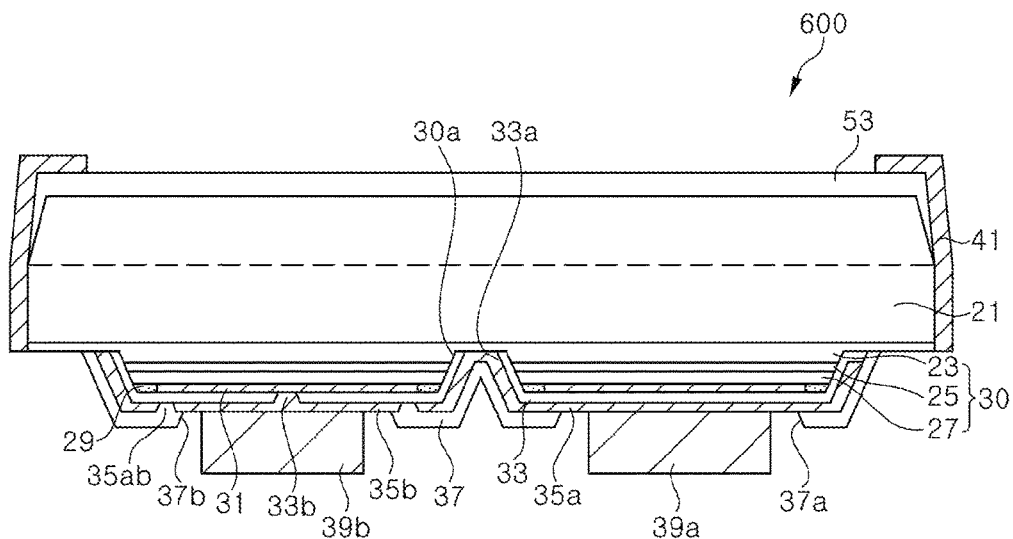
FIG. 7 is a schematic cross-sectional view of a light emitting diode according to yet another exemplary embodiment.

FIG. 7 is a schematic cross-sectional view of a light emitting diode 600 according to yet another exemplary embodiment.

Referring to FIG. 7, the light emitting diode 600 according to this exemplary embodiment is generally similar to the light emitting diode 500 described with reference to FIG. 6 except that the side reflection layer 41 partially covers the substrate 21 along an edge of the upper surface of the substrate 21.

With the side reflection layer 41 formed to cover the upper surface of the substrate 21, the viewing angle of the light emitting diode can be adjusted.

Figure 8:
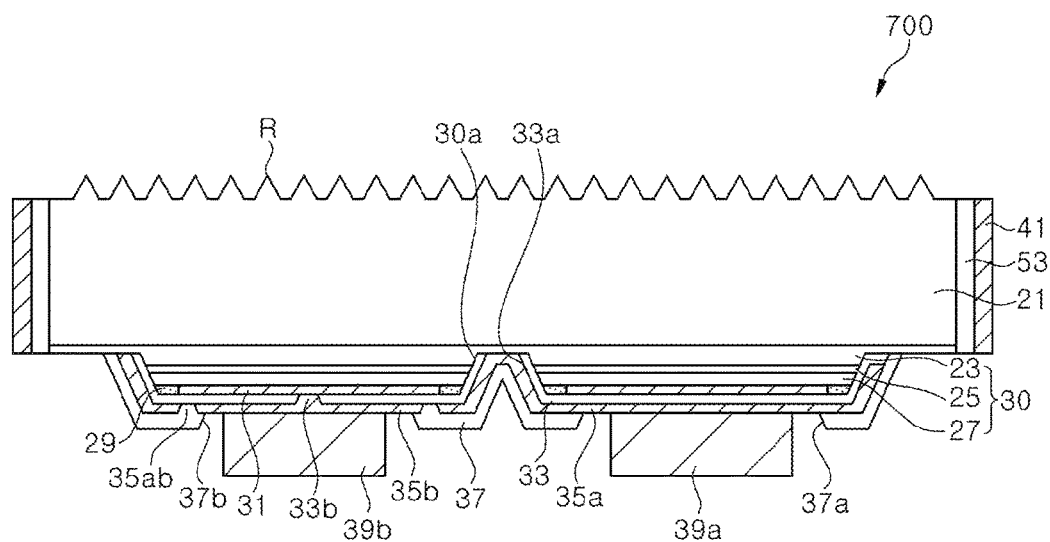
FIG. 8 is a schematic cross-sectional view of a light emitting diode according to yet another exemplary embodiment.

FIG. 8 is a schematic cross-sectional view of a light emitting diode 700 according to yet another exemplary embodiment.

Referring to FIG. 8, the light emitting diode 700 according to this exemplary embodiment is generally similar to the light emitting diode 100 described with reference to FIG. 1 and FIG. 2 except that the side surface of the substrate 21 includes the perpendicular side surface and does not include the inclined side surface. The side reflection layer 41 and the roughness relieving layer 53 are formed on the perpendicular side surface.

Although the side reflection layer 41 and the roughness relieving layer 53 are illustrated as being formed only on the side surface of the substrate 21 in this exemplary embodiment, these layers 41, 53 may be formed to partially cover the upper surface of the substrate 21 along the edge of the substrate 21.

FIG. 9 to FIG. 17 are schematic plan views and cross-sectional views illustrating a method of manufacturing a light emitting diode according to one exemplary embodiment. FIGS. 9A, 10A, 11A, 12A, 13A, 14A, 15A and 16A are plan views and FIGS. 9B, 10B, 11B, 12B, 13B, 14B, 15B and 16B are cross-sectional views taken along line A-A thereof.

Figure 9A:
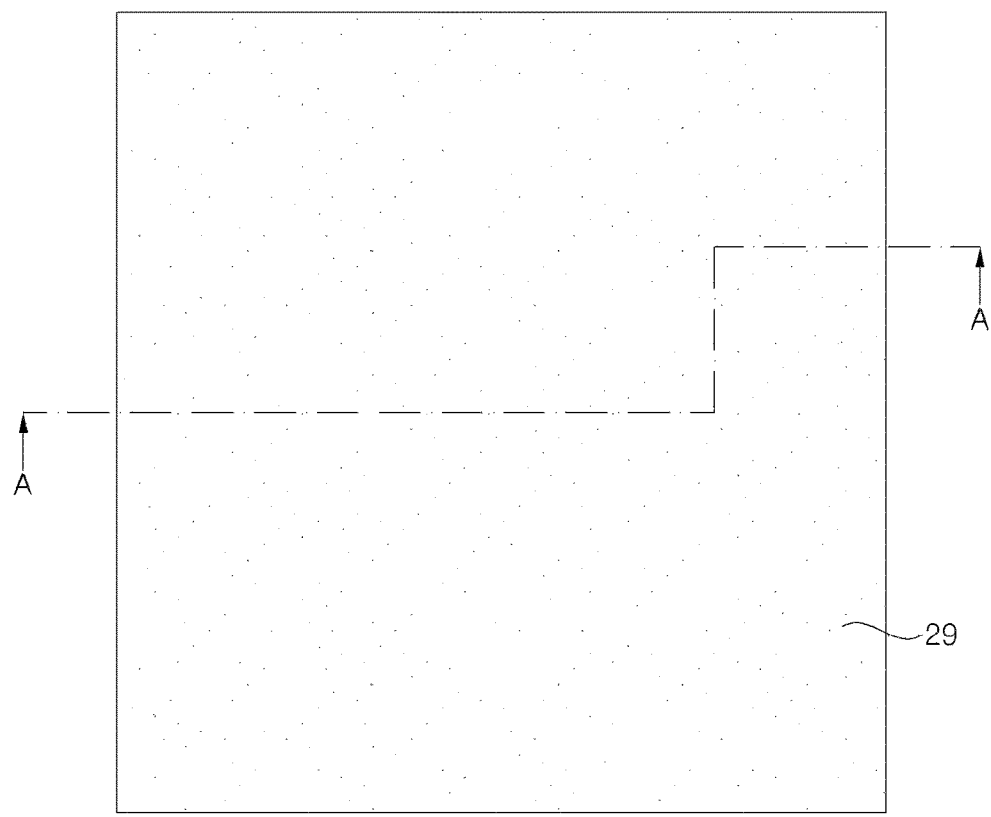
FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 17C, and FIG. 17D are schematic plan views and cross-sectional views illustrating a method of manufacturing a light emitting diode according to one exemplary embodiment.
Figure 9B:
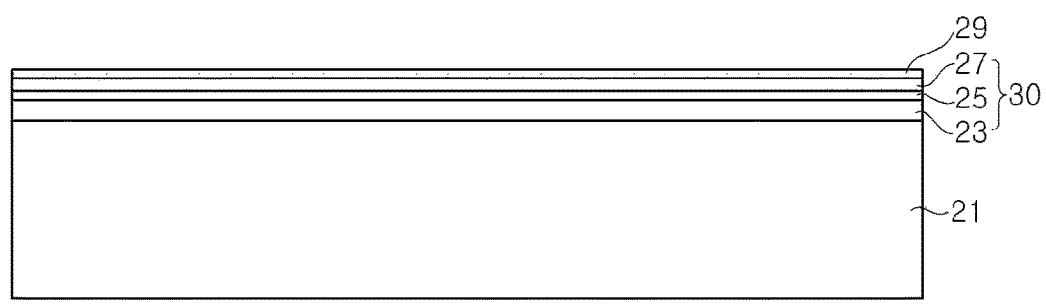

Referring to FIG. 9A and FIG. 9B, a semiconductor stack 30 including a first conductivity type semiconductor layer 23, an active layer 25 and a second conductivity type semiconductor layer 27 is grown on a substrate 21 and an ohmic oxide layer 29 is formed on the semiconductor stack 30.

The substrate 21 may be a sapphire substrate or a gallium nitride-based substrate. The gallium nitride-based semiconductor layer may have an n-type dopant concentration of, for example, $7E17/cm^3$ to $9E17/cm^3$. The first conductivity type semiconductor layer 23 may have an n-type dopant concentration of, for example, $9E18/cm^3$ to $2E19/cm^3$.

The first conductivity type semiconductor layer 23, the active layer 25 and the second conductivity type semiconductor layer 27 may be grown on the substrate 21 within a chamber by any well-known method, such as metal organic chemical vapor deposition (MOCVD) or molecular beam epitaxy (MBE).

The ohmic oxide layer 29 may be formed of, for example, ITO or ZnO. The ohmic oxide layer 29 may be formed by e-beam evaporation or sputtering and may cover the second conductivity type semiconductor layer 27 to form ohmic contact with the second conductivity type semiconductor layer 27.

Figure 10A:
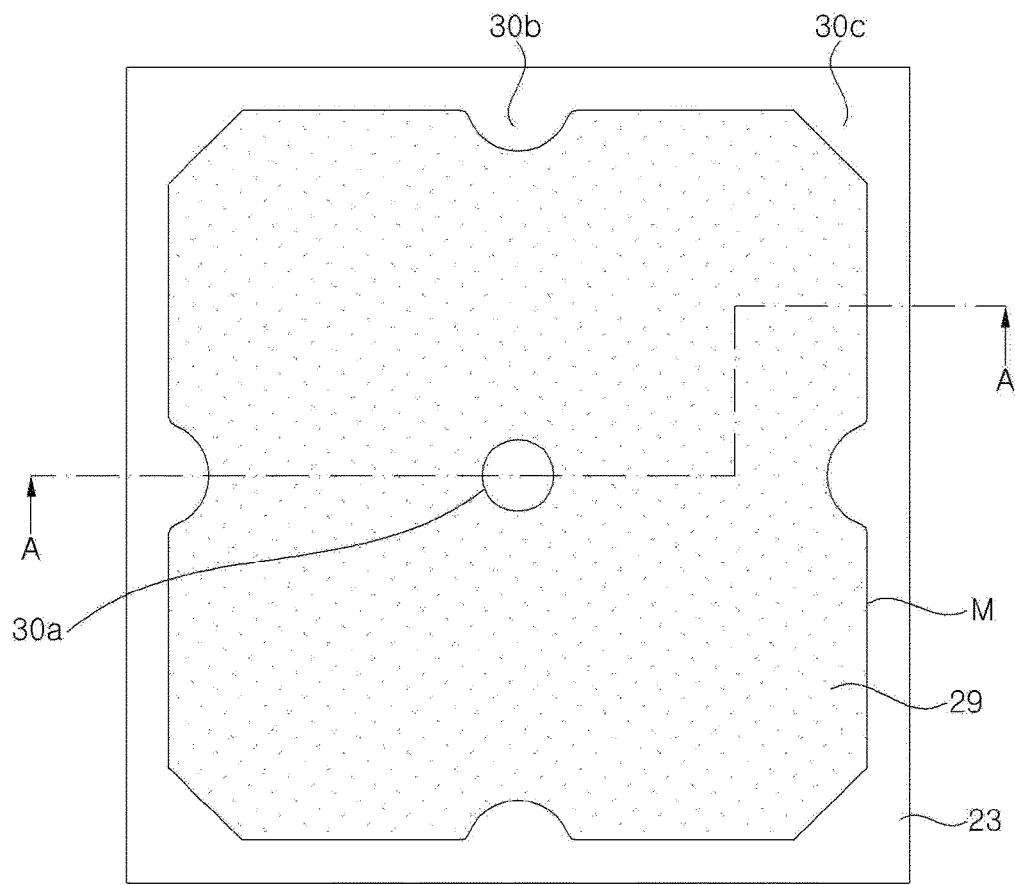
Figure 10B:
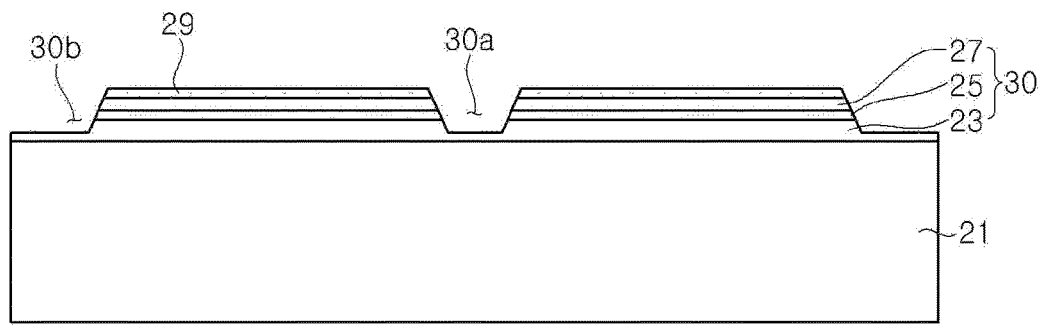

Referring to FIG. 10A and FIG. 10B, a mesa M is formed by patterning the ohmic oxide layer 29 and the semiconductor stack 30. By forming the mesa M, the first conductivity type semiconductor layer 23 is exposed around the mesa M. The mesa M has a through-hole 30a and an indented portion 30b and may be formed to have partially cut corners. The ohmic oxide layer 29 covers substantially the entire upper region of the mesa M and has the same shape as the mesa M in plan view.

In this exemplary embodiment, the ohmic oxide layer 29 may be subjected to patterning by wet etching using a photoresist pattern, and the semiconductor stack 30 may be subjected to patterning by dry etching. However, it should be understood that other implementations are also possible and both the ohmic oxide layer 29 and the semiconductor stack 30 may be subjected to patterning through dry etching. On the other hand, patterning of the ohmic oxide layer 29 and the semiconductor stack 30 may be performed using the same photoresist pattern.

Figure 11A:
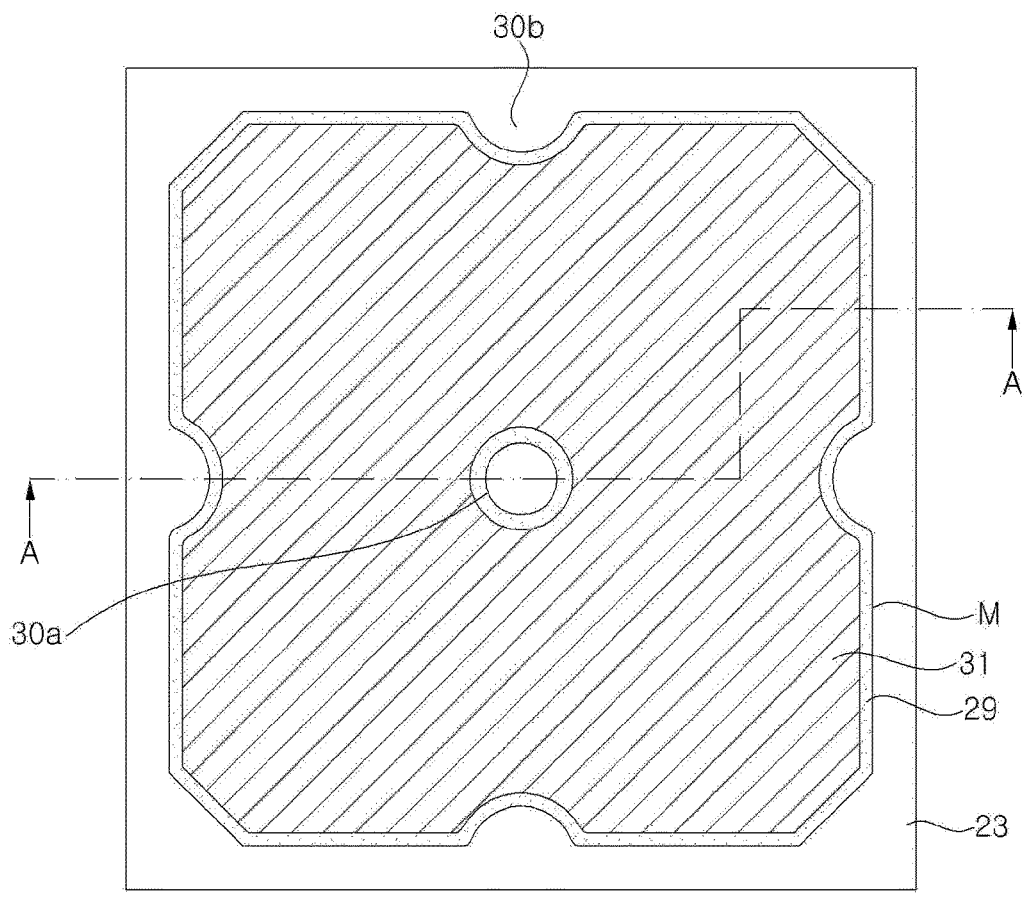
Figure 11B:
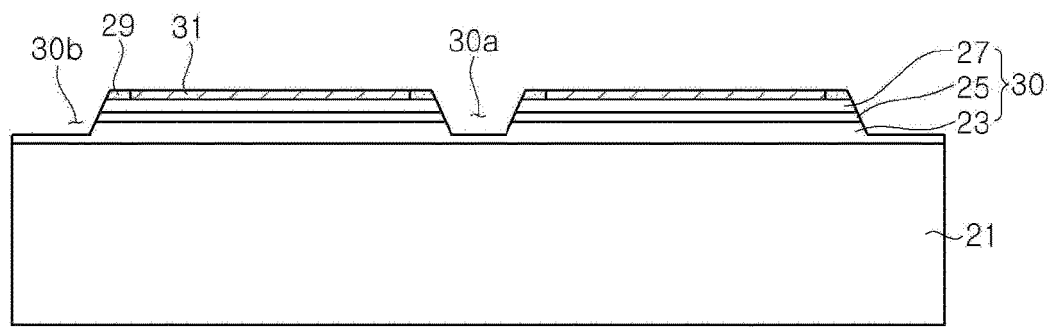

Referring to FIG. 11A and FIG. 11B, the second conductivity type semiconductor layer 27 is exposed by patterning the ohmic oxide layer 29 and an ohmic reflection layer 31 is formed on an exposed region of the second conductivity type semiconductor layer 27. The ohmic reflection layer 31 includes a metal reflection layer such as an Ag or Al layer and may further include an ohmic metal layer such as a Ni layer. Materials for the ohmic reflection layer 31 are described above with reference to FIG. 1 and FIG. 2 and detailed description thereof will be omitted for clarity. The ohmic reflection layer 31 may be formed by e-beam evaporation or sputtering.

Figure 12A:
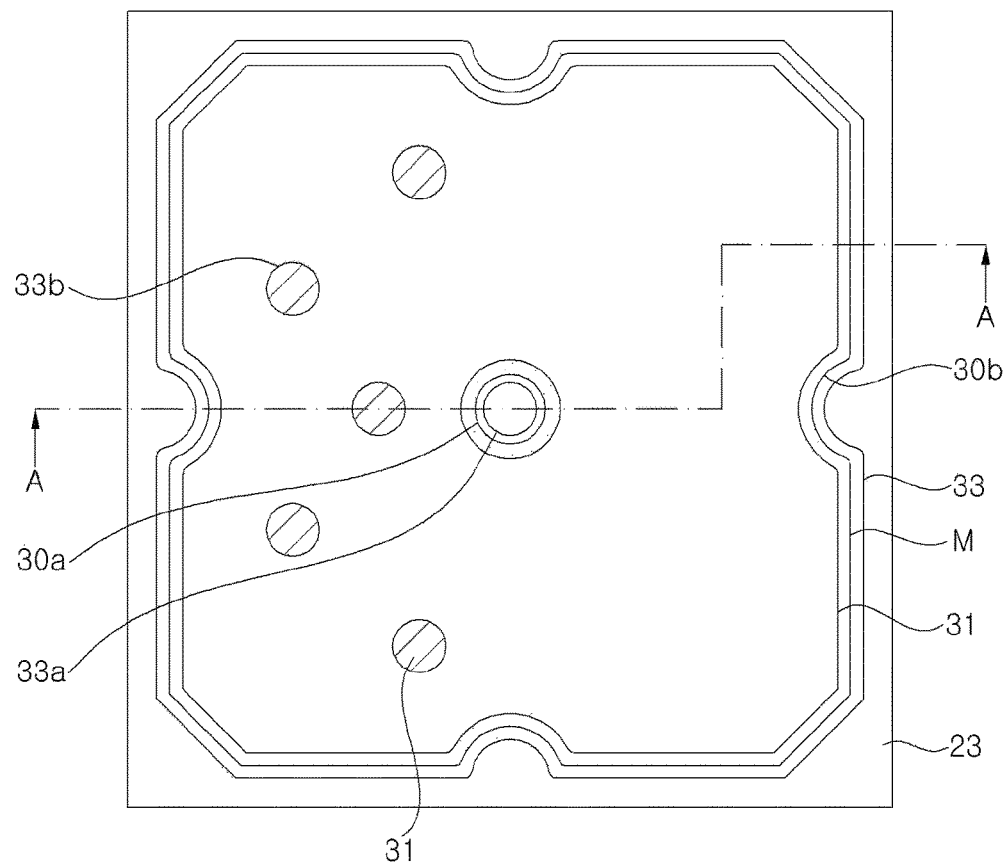
Figure 12B:
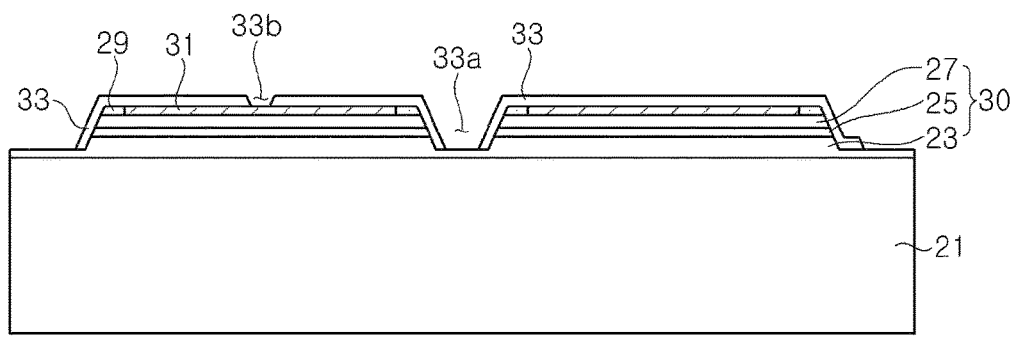

Referring to FIG. 12A and FIG. 12B, a lower insulation layer 33 is formed to cover the ohmic oxide layer 29 and the ohmic reflection layer 31. The lower insulation layer 33 also covers side surfaces of the mesa M and a sidewall of the through-hole 30*a*. On the other hand, the lower insulation layer 33 has first openings 33*a* which expose the first conductivity type semiconductor layer 23 and second openings 33*b* which expose the ohmic reflection layer 31.

For example, the first openings 33*a* may be formed inside the through-hole 30*a* and near the indented portion 30*b*. Furthermore, the lower insulation layer 33 may cover a portion of the first conductivity type semiconductor layer 23 along the periphery of the mesa M. With this structure, the first conductivity type semiconductor layer 23 may be partially exposed along the periphery of the mesa M.

The second openings 33*b* are placed on the ohmic reflection layer 31 above the mesa M. A plurality of second openings 33*b* may be arranged to be biased to one side of the mesa M. The ohmic reflection layer 31 is exposed through the second openings 33*b*. Although the lower insulation layer 33 is shown as having five second openings 33*b* in this exemplary embodiment, it should be understood that other implementations are also possible. The lower insulation layer 33 may have one second opening 33*b* or at least two second openings 33*b*.

Figure 13A:
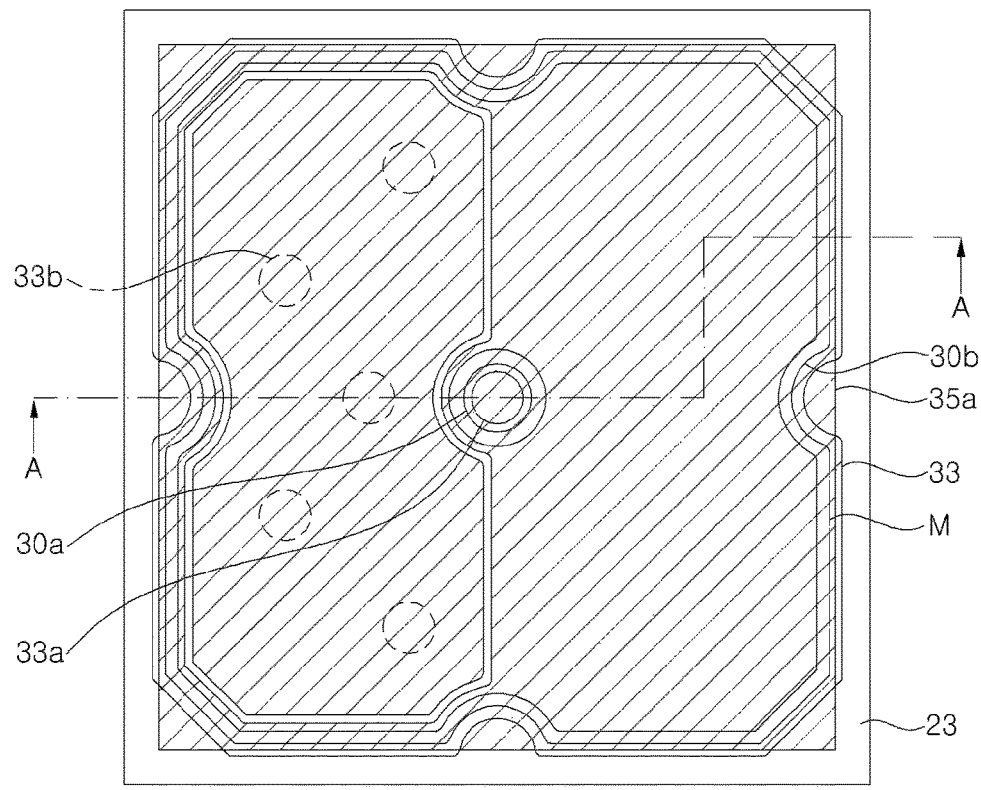
Figure 13B:
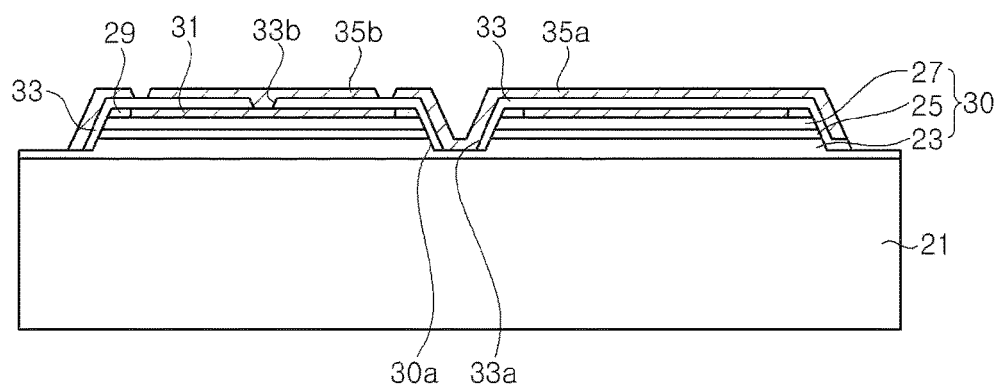

Referring to FIG. 13A and FIG. 13B, a first pad metal layer 35*a* and a second pad metal layer 35*b* are formed on the lower insulation layer 33. The first pad metal layer 35*a* is electrically connected to the first conductivity type semiconductor layer 23 exposed through the first openings 33*a* and the second pad metal layer 35*b* is electrically connected to the ohmic reflection layer 31 exposed through the second openings 33*b*.

The first pad metal layer 35*a* may be connected to the first conductivity type semiconductor layer 23 exposed through the first openings 33*a* formed inside the through-hole 30*a* and near the indented portion 30*b*, and may also be connected to the first conductivity type semiconductor layer 23 near the corners of the mesa M. The first pad metal layer 35*a* may include an inner contact portion contacting the first conductivity type semiconductor layer 23 through the through-hole 30*a* and outer contact portions contacting the first conductivity type semiconductor layer 23 around the mesa M. The inner and outer contact portions of the first pad metal layer 35*a* allow electric current to be uniformly spread over the entirety of the mesa M.

The second pad metal layer 35*b* may be surrounded by the first pad metal layer 35*a* and a boundary region 35*ab* may be formed between the first pad metal layer 35*a* and the second pad metal layer 35*b*. The second pad metal layer 35*b* covers the second openings 33*b* and may be placed only above the mesa M.

The first pad metal layer 35*a* and the second pad metal layer 35*b* may be formed of the same material by, for example, a lift-off process and thus may be placed on the same level.

Figure 14A:
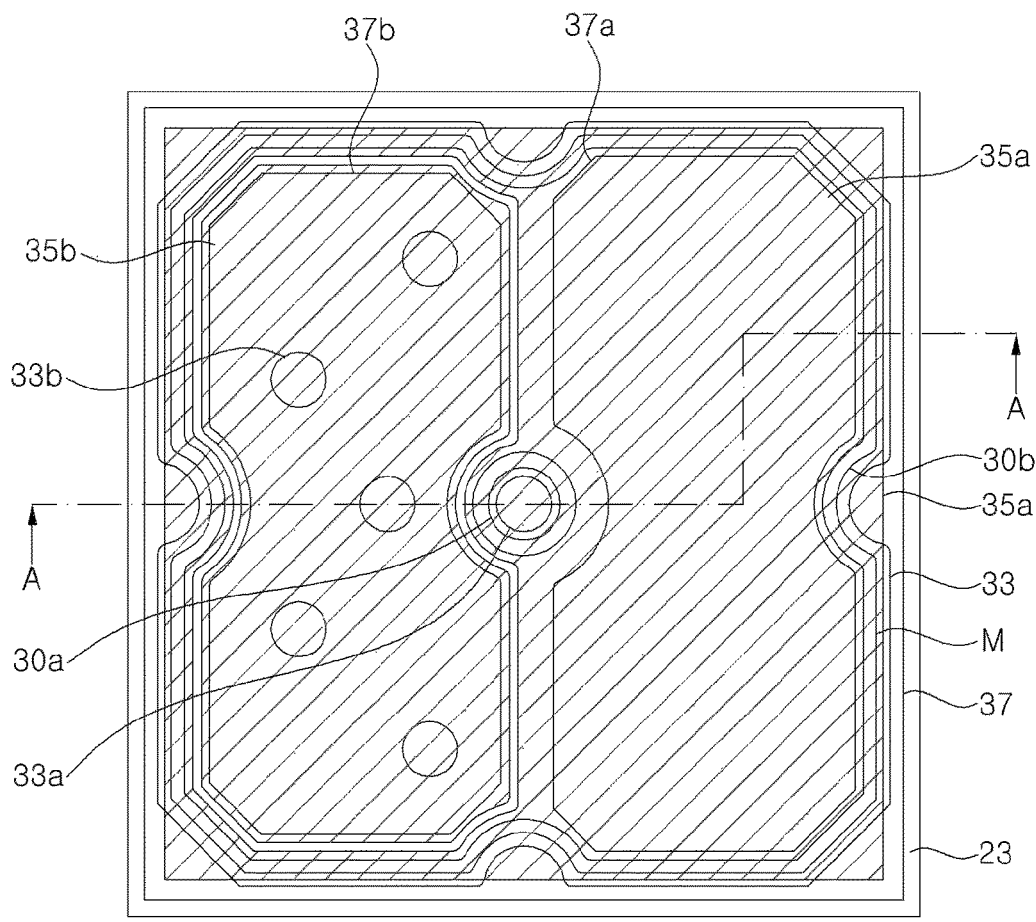
Figure 14B:
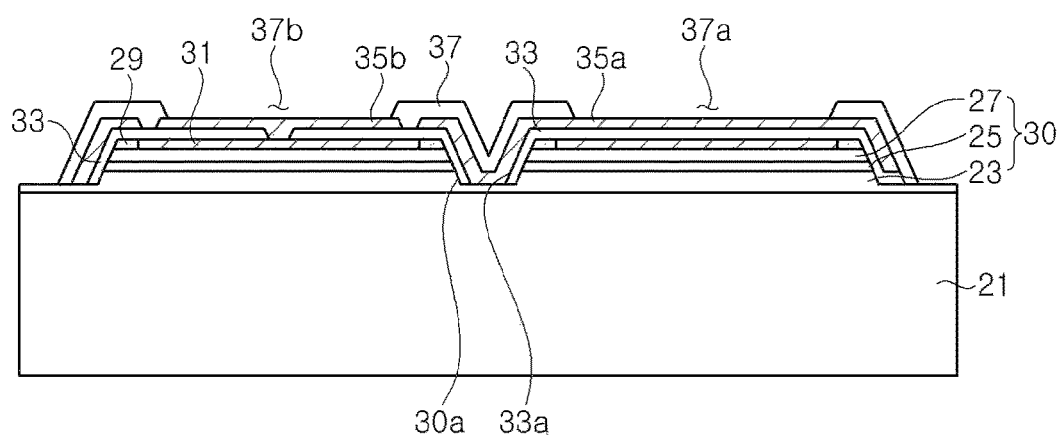

Referring to FIG. 14A and FIG. 14B, an upper insulation layer 37 is formed on the first pad metal layer 35*a* and the second pad metal layer 35*b*. The upper insulation layer 37 includes a first opening 37*a* which exposes the first pad metal layer 35*a* and a second opening 37*b* which exposes the second pad metal layer 35*b*. The upper insulation layer 37 may cover the lower insulation layer 33 around the mesa M and may expose the first conductivity type semiconductor layer 23 along the periphery of the mesa M. The outer contact portions of the first pad metal layer 35*a* formed near the indented portion 30*b* and the corners of the mesa M are also covered by the upper insulation layer 37.

The second opening 37*b* may be placed only in an upper region of the second pad metal layer 35*b*. The first opening 37*a* is placed only in an upper region of the first pad metal layer 35*a*, particularly in an upper region of the mesa M, without being limited thereto. The first opening 37*a* is separated from the second opening 37*b*.

Although each of the first opening 37*a* and the second opening 37*b* is illustrated as being formed singularly in this exemplary embodiment, the upper insulation layer 37 may have a plurality of first openings 37*a* and a plurality of second openings 37*b*.

Furthermore, although the second opening 37*b* is illustrated as overlapping the second openings 33*b* of the lower insulation layer 33, the second opening 37*b* may be formed to be separated from the second openings 33*b* in the lateral direction so as not to overlap each other.

Figure 15A:
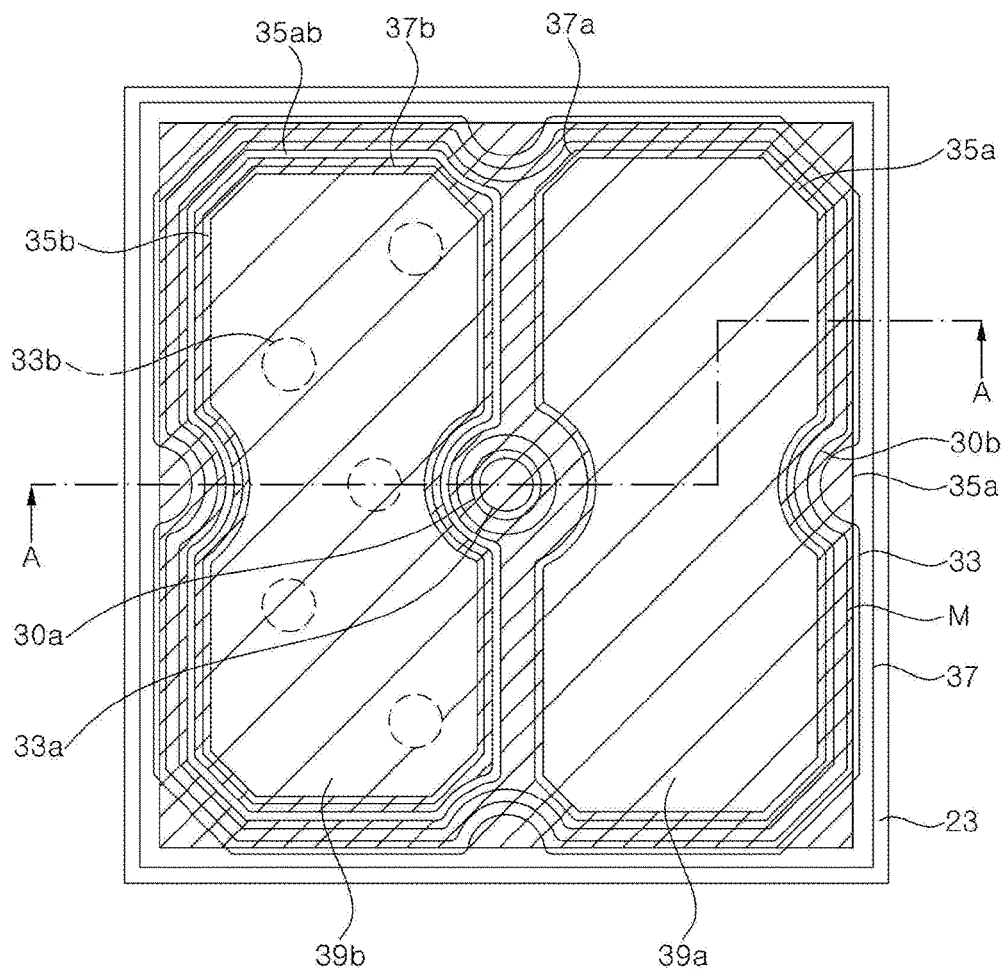
Figure 15B:
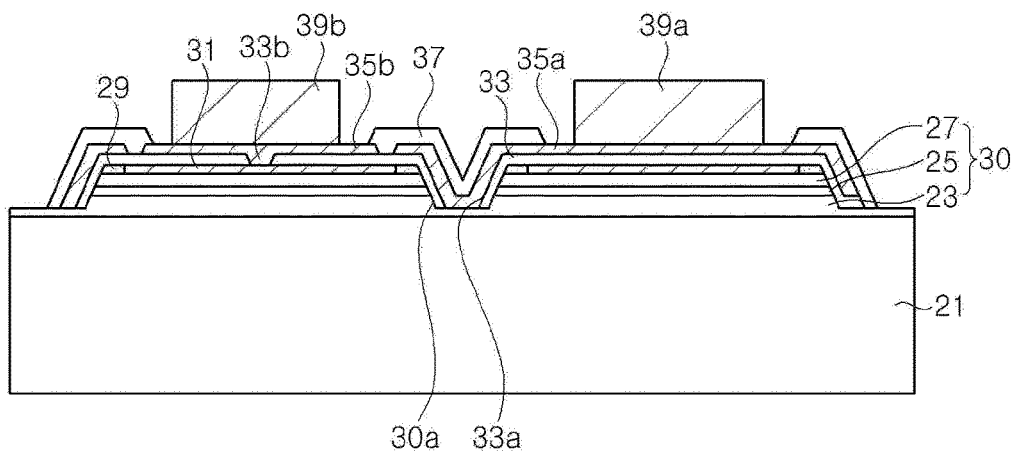

Referring to FIG. 15A and FIG. 15B, a first bump pad 39*a* and a second bump pad 39*b* are formed inside the first and second openings 37*a*, 37*b* of the upper insulation layer 37, respectively. The first and second bump pads 39*a*, 39*b* may be formed of, for example, AuSn. The first and second bump pads 39*a*, 39*b* are pads bonded to a submount or a lead frame when the light emitting diode is mounted on the submount or the lead frame. The first and second bump pads 39*a*, 39*b* may be formed by a well-known process such as a lift-off process.

In this exemplary embodiment, the first and second bump pads 39*a*, 39*b* are formed inside the first and second openings 37*a*, 37*b*, respectively, but are not limited thereto. Alternatively, the first and second bump pads 39*a*, 39*b* may be formed to completely cover the first and second openings 37*a*, 37*b*, respectively.

Figure 16A:
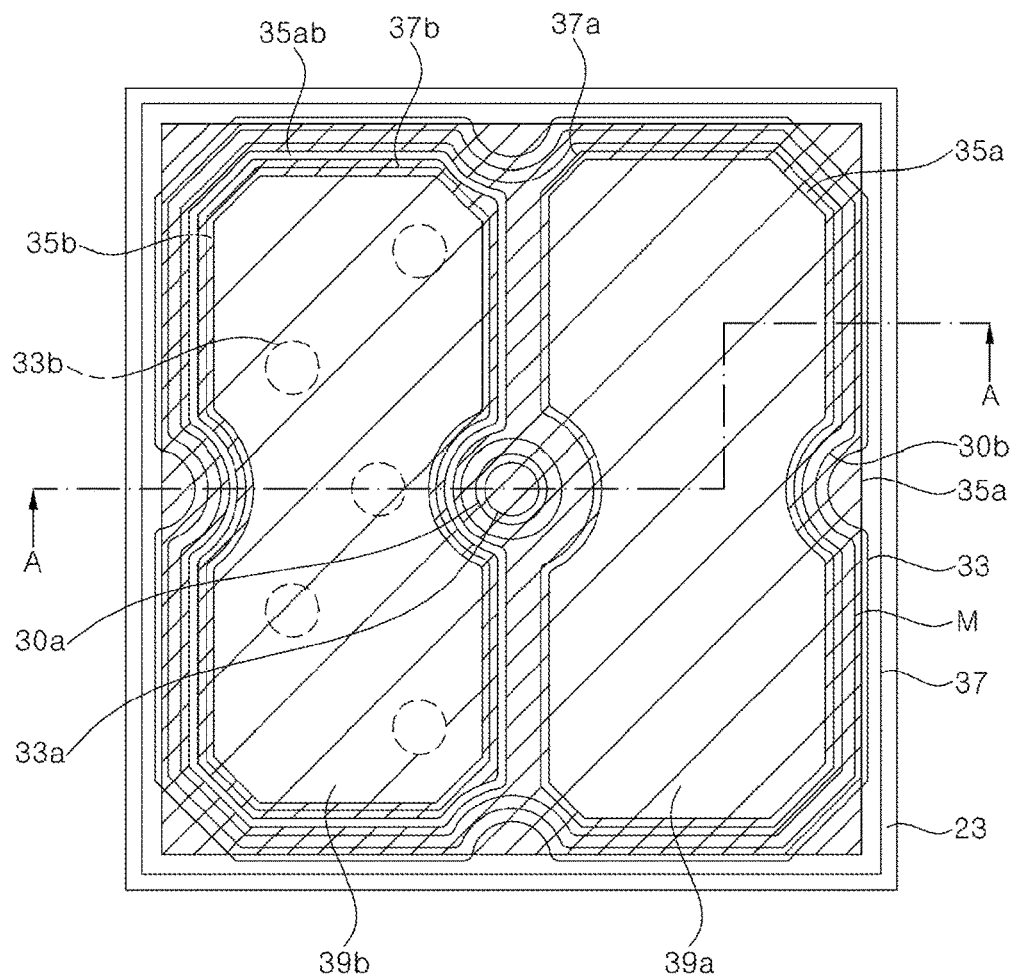
Figure 16B:
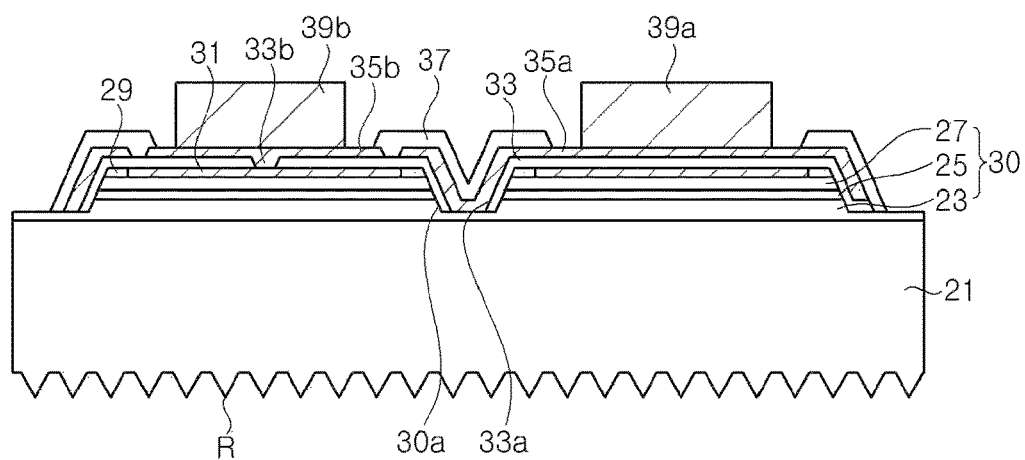

Referring to FIG. 16A and FIG. 16B, after formation of the first and second bump pads 39*a*, 39*b*, a lower surface of the substrate 21 is subjected to grinding to reduce the thickness of the substrate 21 and a roughness R is formed on the ground lower surface of the substrate 21. The lower surface of the substrate 21 may be ground by lapping and/or polishing and the roughness R may be formed by dry and wet etching. In some exemplary embodiments, the process of forming the roughness R can be omitted.

Referring to FIG. 17, a method of forming a side reflection layer 41 on a side surface of the substrate 21 will be described. FIG. 17 shows schematic cross-sectional views illustrating the method of forming the side reflection layer 41 of the light emitting diode 100 according to the exemplary embodiment. Although FIG. 17 shows two light emitting diode regions formed by the processes described with reference to FIG. 9 to FIG. 16, a larger number of light emitting diode regions may be formed on the substrate 21, and the mesa M and the bump pads 39*a*, 39*b* may be formed on each of the light emitting diode regions.

Figure 17A:
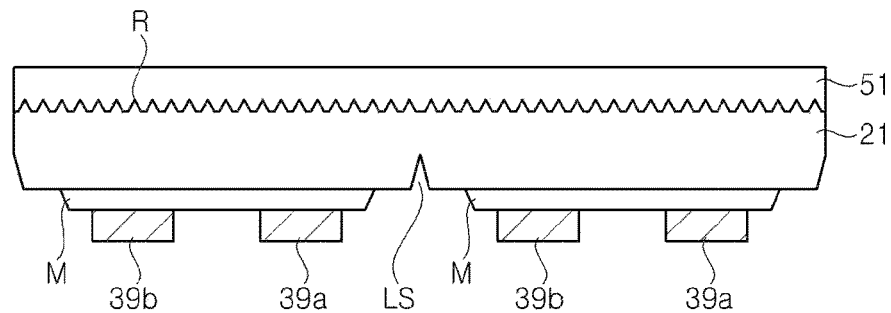

Referring to FIG. 17A, after formation of the first and second bump pads 39*a*, 39*b*, a scribing line LS is formed from the first conductivity type semiconductor layer 23 into the substrate 21. The scribing line LS corresponds to an isolation region between light emitting diodes and thus a plurality of scribing lines LSs may be formed in a mesh shape on the substrate 21. The scribing line LS may be formed using a laser or a blade.

A masking material 51 is coated onto the substrate 21, for example, onto the surface of the substrate on which the roughness R is formed. The masking material 51 may be formed on the substrate 21 by spin coating or the like. The masking material 51 may be, for example, a photoresist layer.

Figure 17B:
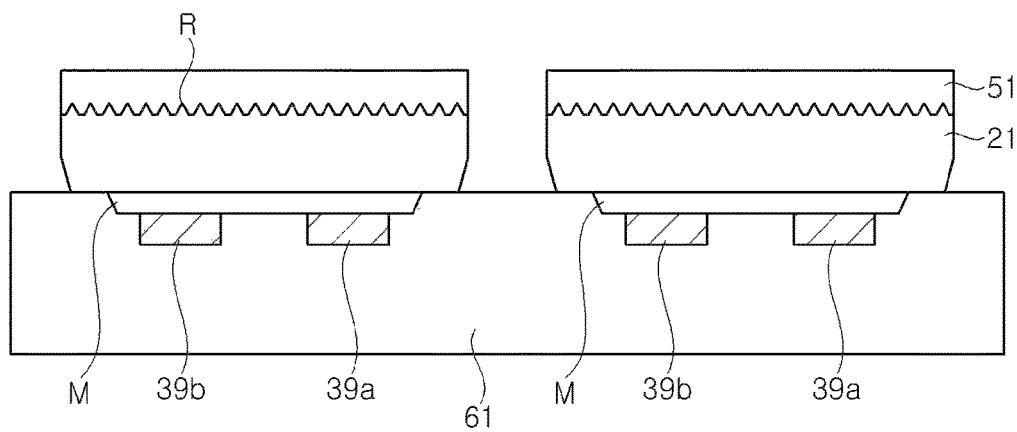

Referring to FIG. 17B, individual light emitting diode regions are divided from each other on a stretchable tape such as a blue tape, which in turn is stretched to separate the individual light emitting diode regions from each other. Thereafter, the divided individual light emitting diode regions are transferred to a support 61 such that the individual light emitting diodes can be attached thereto. For example, the support 61 may be a polymer or polyimide film or another support substrate. The divided individual light emitting diode regions may be individually transferred to a polymer or polyimide film, or may be attached or transferred to the support substrate. Here, the mesa M may be embedded in the support 61 such that the first conductivity type semiconductor layer 23 exposed around the mesa M can adjoin an upper surface of the support 61. However, it should be understood that other implementations are also possible. A contact region between the light emitting diode regions and the support 61 may be adjusted and the first conductivity type semiconductor layer 23 may be partially embedded in the support 61 in the thickness direction.

On the other hand, the side surface of the substrate 21 in each of the individual light emitting diode regions may have an inclined side surface formed by scribing and a perpendicular side surface formed by breaking. The inclined side surface formed by the scribing is rougher than the perpendicular side surface formed by breaking. Although the surface of the substrate may be subjected to etching using phosphoric acid or hydrochloric acid in order to relieve roughness of such a rough surface, there is a limit in improvement of surface roughness.

Figure 17C:
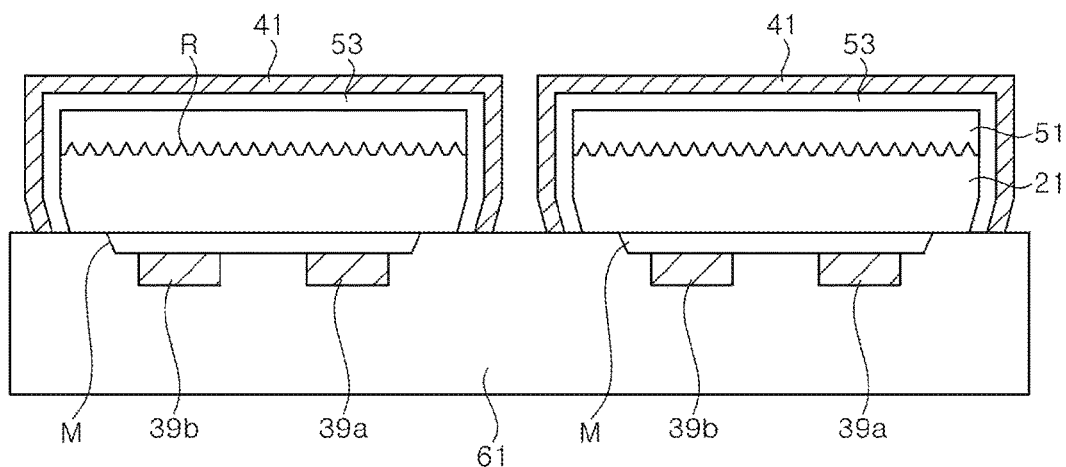

Referring to FIG. 17C, a roughness relieving layer 53 is deposited on each of the individual light emitting diode regions, followed by deposition of a side reflection layer 41. The roughness relieving layer 53 may be formed by depositing, for example, ITO or $SiO_2$ through plasma enhanced chemical vapor deposition (PECVD) or sputtering. The side reflection layer 41 includes a metal reflection layer such as an Ag layer or an Al layer. The side reflection layer 41 is the same as the side reflection layer described with reference to FIG. 1 and FIG. 2 and detailed description thereof will be omitted.

Each of the roughness relieving layer 53 and the side reflection layer 41 is formed on the side surface of the substrate 21 to have a substantially uniform thickness on the inclined side surface and the perpendicular side surface. Since the exposed surface of the first conductivity type semiconductor layer 23 is shielded by the support 61, the roughness relieving layer 53 and the side reflection layer 41 are prevented from being formed on the exposed surface of the first conductivity type semiconductor layer 23. Therefore, the side reflection layer 41 can be prevented from overlapping the first pad metal layer 35a.

Figure 17D:
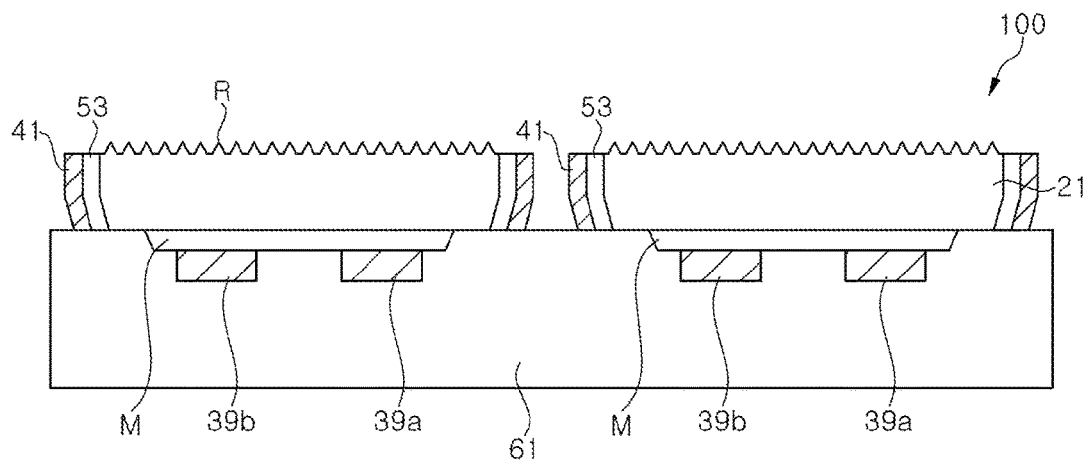

Referring to FIG. 17D, the side reflection layer 41 can be removed from the upper side of the substrate 21 by removing the masking material 51 and the light emitting diode 100 is completed by removing the support 61 therefrom.

Although the scribing line LS is formed using a laser in this exemplary embodiment, the scribing line LS may be formed using a blade. When the scribing line LS is formed using the blade, the inclined side surface of the substrate 21 may be formed to have a gentler inclination.

In addition, although the scribing line LS is formed after formation of the first and second bump pads 39a, 39b in this exemplary embodiment, the scribing line LS may also be formed before formation of the upper insulation layer 37. In this case, the upper insulation layer 37 may be formed inside the scribing line LS, thereby providing the light emitting diode 200 as shown in FIG. 3.

By patterning the masking material 51 in advance, the side reflection layer 41 and the roughness relieving layer 53 may partially cover the upper surface of the substrate 21 along an edge of the upper surface of the substrate 21.

In this exemplary embodiment, the roughness relieving layer 53 and the side reflection layer 41 are removed from the substrate by a lift-off process using the masking material 51. However, it should be understood that various techniques such as peeling off may be used to remove the roughness relieving layer 53 and the side reflection layer 41 from the upper surface of the substrate 21.

FIG. 18 shows cross-sectional views illustrating a method of manufacturing a light emitting diode 300 according to another exemplary embodiment. As described with reference to FIG. 9 to FIG. 16, light emitting diode regions are formed on a substrate 21, and a mesa M and bump pads 39a, 39b are formed on each of the light emitting diode regions.

Figure 18A:
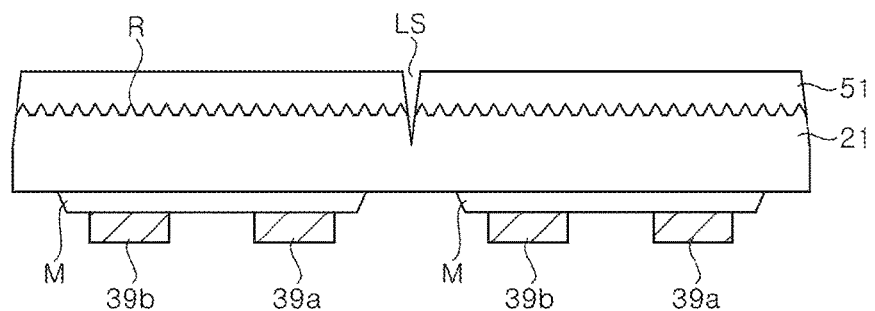
FIG. 18A, FIG. 18B, FIG. 18C, and FIG. 18D are schematic cross-sectional views illustrating a method of manufacturing a light emitting diode according to another exemplary embodiment.

Referring to FIG. 18A, after formation of the first and second bump pads 39a, 39b, for example, a masking material 51 is coated onto the substrate 21 having a roughness R thereon. The masking material 51 may be formed on the substrate 21 by spin coating or the like.

Then, a scribing line LS is formed on an upper surface of the substrate 21, that is, from the masking material 51 side into the substrate 21. The scribing line LS corresponds to an isolation region between light emitting diodes and thus a plurality of scribing lines LSs may be formed in a mesh shape on the substrate 21. The scribing line may be formed using a laser and chemical treatment such as hydrochloric acid and/or phosphoric acid treatment may be performed in order to remove debris from the side surface of the substrate 21 while relieving surface roughness of the substrate 21 formed by the laser.

Figure 18B:
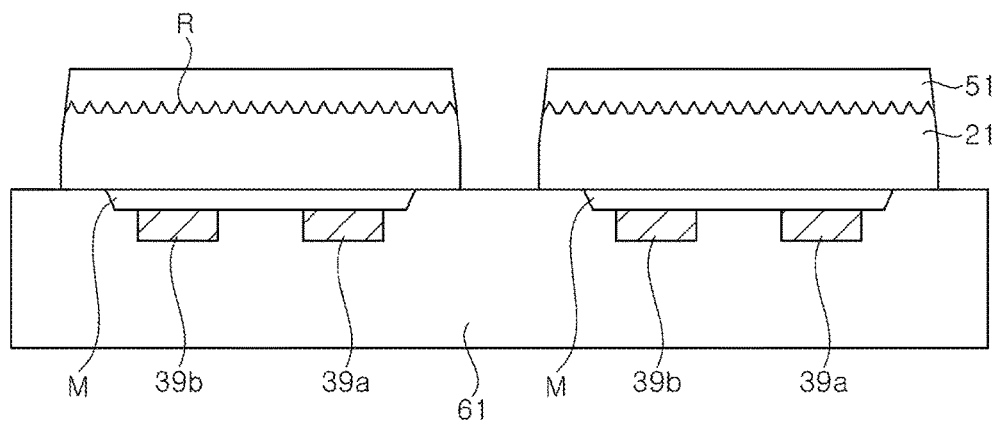

Referring to FIG. 18B, individual light emitting diode regions are divided from each other on a stretchable tape such as a blue tape, which in turn is stretched to separate the individual light emitting diode regions from each other, as described with reference to FIG. 17B. Thereafter, the divided individual light emitting diode regions are transferred to a support 61 such that the individual light emitting diodes can be attached thereto.

On the other hand, the side surface of the substrate 21 in the individual light emitting diode regions may have an inclined side surface formed by scribing and a perpendicular side surface formed by breaking.

Figure 18C:
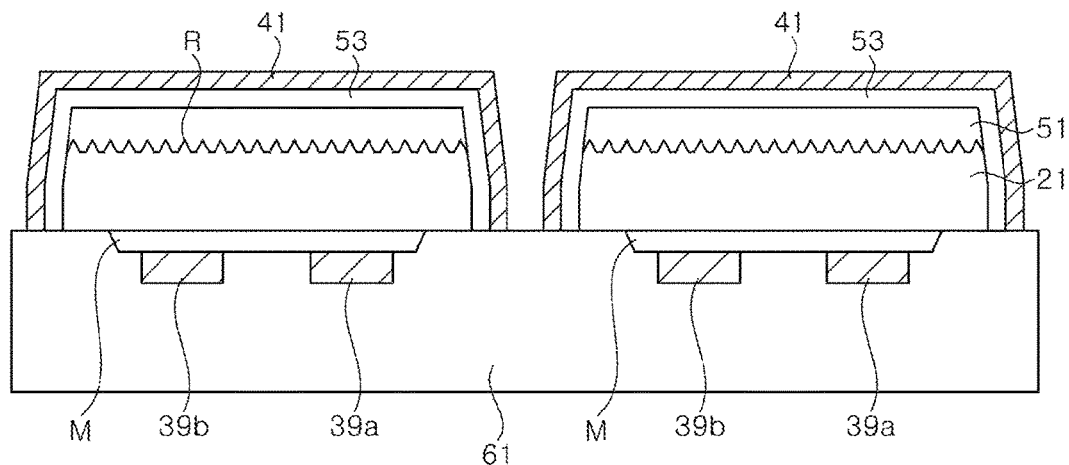

Referring to FIG. 18C, a roughness relieving layer 53 and a side reflection layer 41 are deposited on each of the individual light emitting diode regions. The roughness relieving layer 53 may be formed by PECVD or sputtering. The side reflection layer 41 may be formed by, for example, sputtering. The roughness relieving layer 53 includes, for example, an ITO layer or a $SiO_2$ layer, and the side reflection layer 41 includes a metal reflection layer such as an Ag layer or an Al layer. The side reflection layer 41 is the same as the side reflection layer described with reference to FIG. 1 and FIG. 2 and detailed description thereof will be omitted.

Each of the roughness relieving layer 53 and the side reflection layer 41 is formed on the side surface of the substrate 21 to have a substantially uniform thickness on the inclined side surface and the perpendicular side surface. Since the exposed surface of the first conductivity type semiconductor layer 23 is shielded by the support 61, the side reflection layer 41 is prevented from being formed on the exposed surface of the first conductivity type semiconductor layer 23. Therefore, the side reflection layer 41 can be prevented from overlapping the first pad metal layer 35*a*, and the roughness relieving layer 53 is separated from the mesa M in the lateral direction.

Figure 18D:
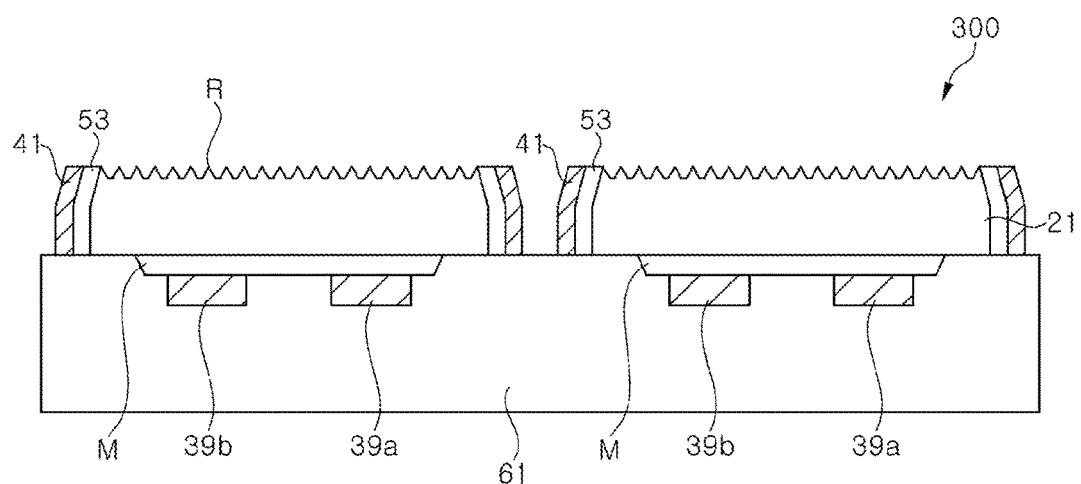

Referring to FIG. 18D, the side reflection layer 41 can be removed from the upper surface of the substrate 21 by removing the masking material 51 and the light emitting diode 300 is completed by removing the support 61 therefrom.

Although the scribing line LS is formed using a laser in this exemplary embodiment, the scribing line LS may also be formed using a blade. In this case, the inclined side surface of the substrate 21 may be formed to have a gentler inclination.

In this exemplary embodiment, the masking material 51 is deposited to cover the entirety of the upper surface of the substrate 21. Alternatively, the masking material 51 may be subjected to patterning so as to expose the scribing line before scribing. Thus, the upper surface of the substrate 21 can be exposed near the scribing line LS. As a result, the roughness relieving layer 53 and the side reflection layer 41 may cover the upper surface of the substrate 21 exposed along the edge of the substrate 21, thereby providing the light emitting diode 400 as shown in FIG. 5.

Although the roughness relieving layer 53 and the side reflection layer 41 are removed from the upper surface of the substrate 21 through the lift-off process using the masking material 51 in this exemplary embodiment, the roughness relieving layer 53 and the side reflection layer 41 may be removed therefrom by peeling off.

FIG. 19 shows cross-sectional views illustrating a method of manufacturing a light emitting diode 600 according to another exemplary embodiment.

As described with reference to FIG. 9 to FIG. 16, light emitting diode regions are formed on a substrate 21, and a mesa M and bump pads 39*a*, 39*b* are formed on each of the light emitting diode regions. Although the roughness R is omitted in this exemplary embodiment, the roughness may be formed on an upper surface of the substrate 21.

Figure 19A:
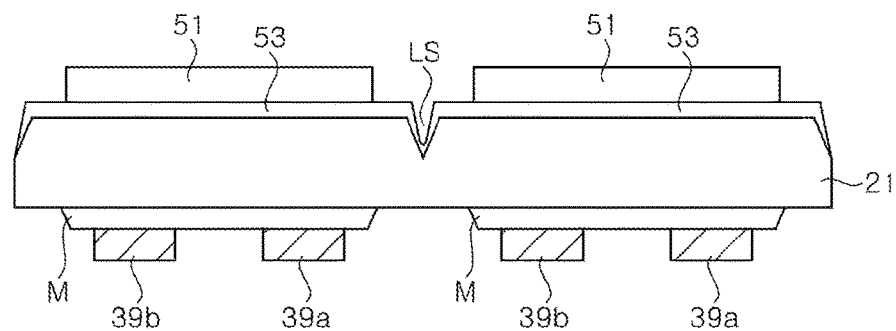
FIG. 19A, FIG. 19B, FIG. 19C, and FIG. 19D are schematic cross-sectional views illustrating a method of manufacturing a light emitting diode according to another exemplary embodiment.

Referring to FIG. 19A, after formation of the first and second bump pads 39*a*, 39*b*, a scribing line LS is formed on the upper surface of the substrate 21. The scribing line LS corresponds to an isolation region between light emitting diodes and thus a plurality of scribing lines LSs may be formed in a mesh shape on the substrate 21.

Then, a roughness relieving layer 53 is formed to cover the upper surface of the substrate 21. The roughness relieving layer 53 is also disposed inside the scribing lines LS. The roughness relieving layer 53 may be formed by PECVD or sputtering and may include, for example, a SiO$_2$ layer.

Then, for example, a masking material 51 is coated onto the substrate 21. The masking material 51 may be formed on the substrate 21 by spin coating or the like, and then subjected to patterning. The masking material 51 may be formed in, for example, a photoresist pattern to expose the scribing lines LS.

In the above exemplary embodiment of FIG. 18, the scribing line LS is formed after formation of the masking material 51, whereas the scribing lines LS and the roughness relieving layer 53 are formed before formation of the masking material 51 in this exemplary embodiment.

Figure 19B:
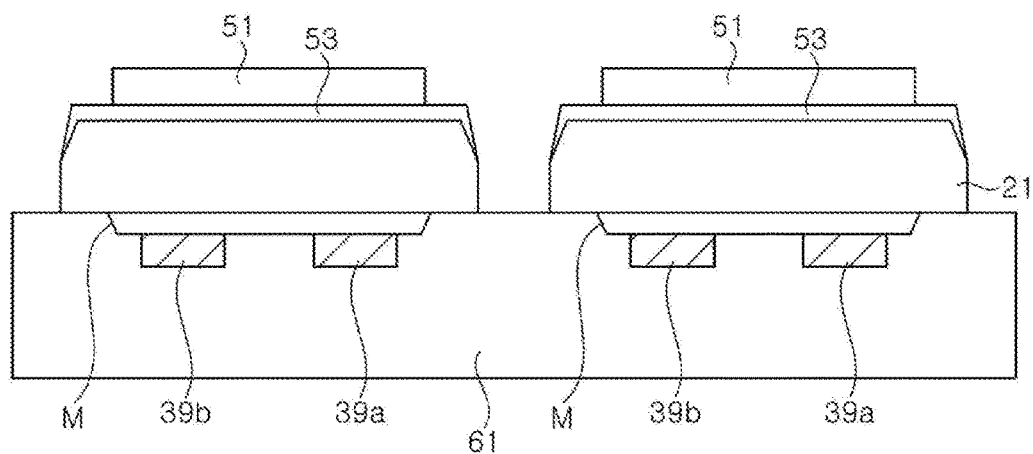

Referring to FIG. 19B, individual light emitting diode regions are divided from each other on a stretchable tape such as a blue tape, which in turn is stretched to separate the individual light emitting diode regions from each other, as described with reference to FIG. 17B. Thereafter, the divided individual light emitting diode regions are transferred to a support 61 such that the individual light emitting diodes can be attached thereto.

The side surface of the substrate 21 in the individual light emitting diode regions may have an inclined side surface formed by scribing and a perpendicular side surface formed by breaking.

Figure 19C:
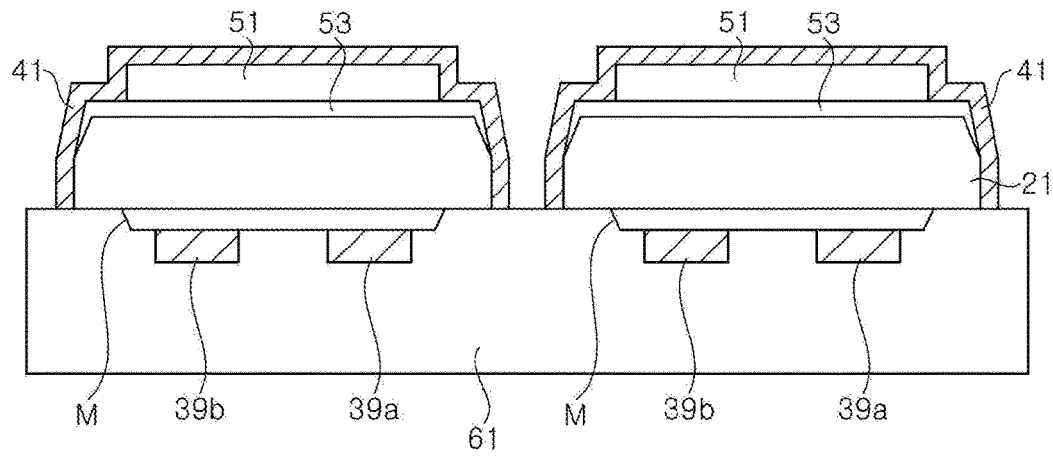

Referring to FIG. 19C, a side reflection layer 41 is deposited on each of the individual light emitting diode regions. The side reflection layer 41 may be deposited thereon by, for example, sputtering. The side reflection layer 41 includes a metal reflection layer such as an Ag layer or an Al layer. The side reflection layer 41 is the same as the side reflection layer described with reference to FIG. 1 and FIG. 2 and detailed description thereof will be omitted.

The side reflection layer 41 may directly contact the perpendicular side surface while covering the roughness relieving layer 53 on the inclined side surface. Furthermore, the side reflection layer 41 partially covers the roughness relieving layer 53 along an edge of the upper surface of the substrate 21 and covers the masking material 51. On the other hand, since the exposed surface of the first conductivity type semiconductor layer 23 is shielded by the support 61, the side reflection layer 41 is prevented from being formed on the exposed surface of the first conductivity type semiconductor layer 23. Therefore, the side reflection layer 41 can be prevented from overlapping the first pad metal layer 35*a*.

Figure 19D:
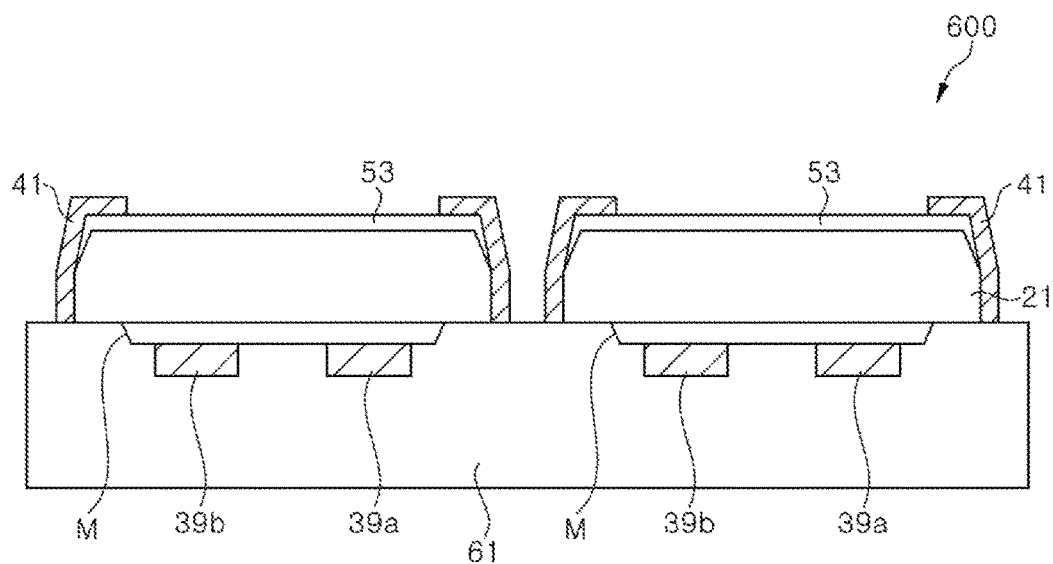

Referring to FIG. 19D, the side reflection layer 41 can be removed from the upper surface of the substrate 21 by removing the masking material 51 and the light emitting diode 600 is completed by removing the support 61 therefrom.

In this exemplary embodiment, the masking material 51 is subjected to patterning such that the side reflection layer 41 partially covers the roughness relieving layer 53 along the edge of the upper surface of the substrate 21. Alternatively, the masking material 51 may be deposited to cover the entirety of the upper surface of the substrate 21. In this case, the light emitting diode 500 may include the side reflection layer 41 formed only on the side surface of the substrate 21.

Although the scribing line LS is formed using a laser in this exemplary embodiment, the scribing line LS may be formed using a blade. In this case, the inclined side surface of the substrate 21 may be formed to have a gentler inclination.

Although the side reflection layer 41 is removed from the upper surface of the substrate 21 through the lift-off process in this exemplary embodiment, the side reflection layer 41 may be removed therefrom by peeling off.

In the above description, various techniques for forming the side reflection layer 41 using laser scribing or blade scribing have been described.

The substrate 21 may be divided using a stealth laser that forms a focus inside the substrate 21. In this case, the side surface of the substrate 21 is formed to have a perpendicular side surface. Accordingly, the light emitting diode 700 of FIG. 8 can be manufactured by a dicing technique using the stealth laser. In addition, a rough surface may be formed in a band shape along the side surface of the substrate 21 through irradiation using the stealth laser, and the roughness relieving layer 53 improves reflectivity of the side reflection layer 41 by relieving roughness of the roughened surface.

Figure 20:
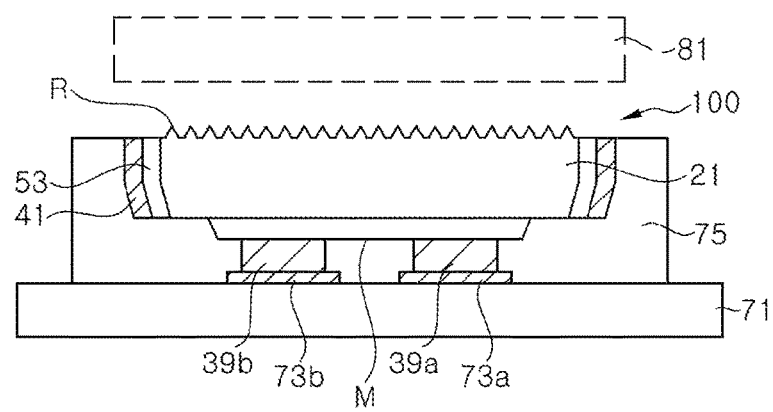
FIG. 20 is a schematic cross-sectional view of a light emitting module according to one exemplary embodiment.

FIG. 20 is a schematic cross-sectional view of a light emitting module according to one exemplary embodiment.

Referring to FIG. 20, the light emitting module includes a support substrate 71, a light emitting diode 100, and a wavelength converter 81. The light emitting module may further include a white barrier layer 75.

The light emitting diode 100 is the same as the light emitting diode described with reference to FIG. 1 and FIG. 2, and is flip bonded onto the support substrate 71, on which the first and second pads 73a, 73b are disposed, via the first and second bump pads 39a, 39b. The support substrate 71 may be, for example, a submount, a printed circuit board, or a lead frame.

The white barrier layer 75 may cover the side surface of the light emitting diode 100. The white barrier layer 75 may be formed by mixing, for example, $TiO_2$ with a silicone resin, an epoxy resin, an epoxy molding compound (EMC), or a silicone molding compound (SMC). The white barrier layer 75 can have defects such as cracks therein over time. Thus, when the white barrier layer 75 is directly formed on the side surface of the light emitting diode without the side reflection layer 41, light emitted from the light emitting diode can leak through the white barrier layer 75. However, according to the exemplary embodiments, the side reflection layer 41 is formed on the side surface of the light emitting diode, thereby providing a light emitting module that does not suffer from light leakage even after use for a long period of time.

The wavelength converter 81 such as a phosphor sheet or a wavelength converting plate may be disposed on an upper side of the light emitting diode 100. The wavelength converter 81 may be a phosphor sheet or a wavelength converting plate, without being limited thereto. The wavelength converter 81 may be directly formed on the light emitting diode 100 using a mixture of a resin and phosphors. The wavelength converting 81 may contain ceramic plate phosphors, particularly, phosphor-in-glass (PIG) or SiC phosphors. With this structure, it is possible to provide a wavelength converter that can be used for a long time by preventing discoloration under high temperature conditions.

The wavelength converting 81 may be attached to the light emitting diode 100 using a bonding agent, or may be attached to the white barrier layer 75 or other components. Thus, the wavelength converting 81 may be disposed above the light emitting diode 100 to be separated from the light emitting diode 100.

Although this exemplary embodiment is illustrated using the light emitting diode 100 by way of example, other light emitting diodes 200, 300, 400, 500, 600, or 700 may also be used.

The light emitting module according to this exemplary embodiment may be applied to automobile headlamps, camera flashes, or lighting.

Although the wavelength converter 81 is illustrated as being disposed on the light emitting diode 100 within the light emitting module in this exemplary embodiment, the wavelength converter 81 may also be directly attached to the light emitting diode 100.

Figure 21:
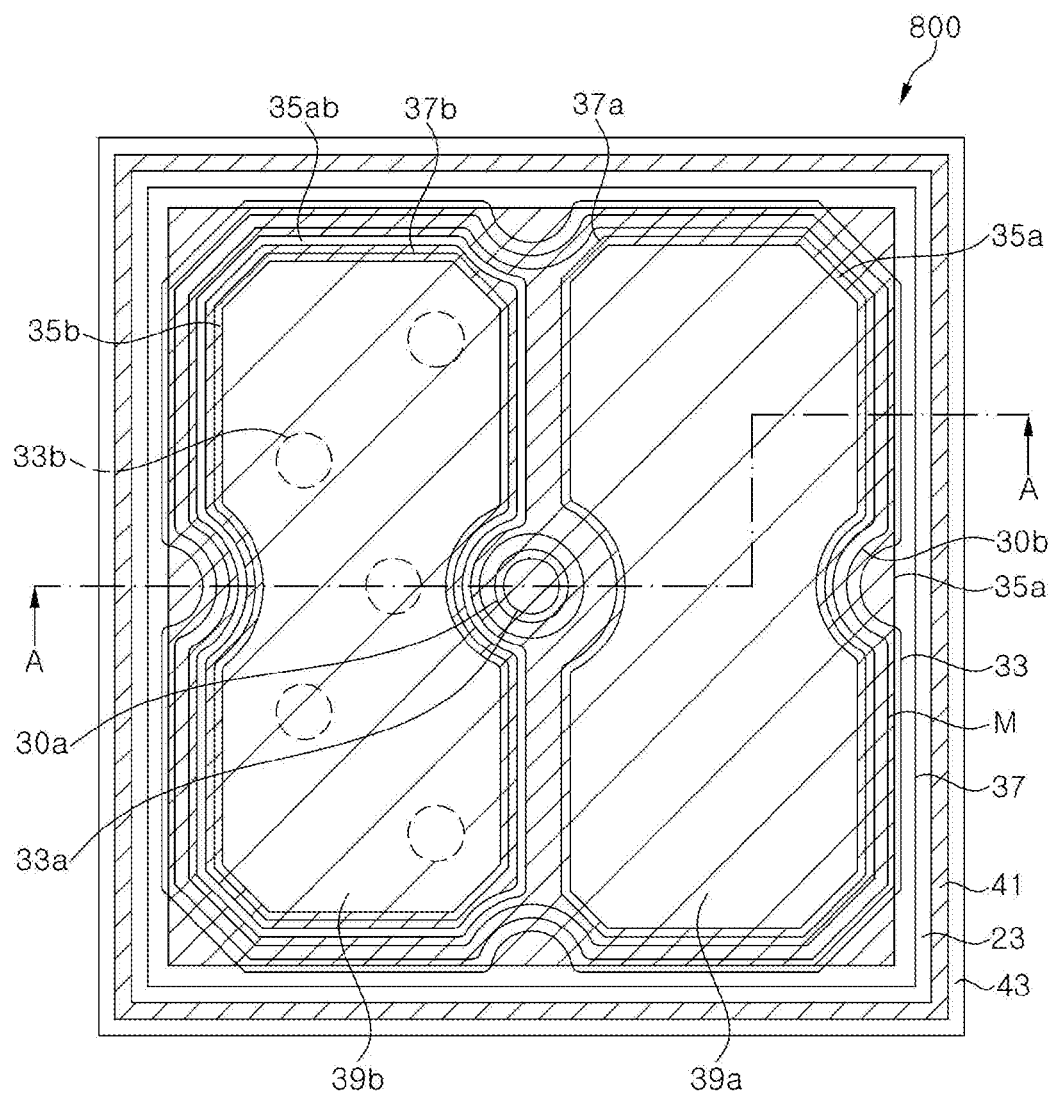
FIG. 21 is a schematic plan view of a light emitting diode according to yet another exemplary embodiment
Figure 22:
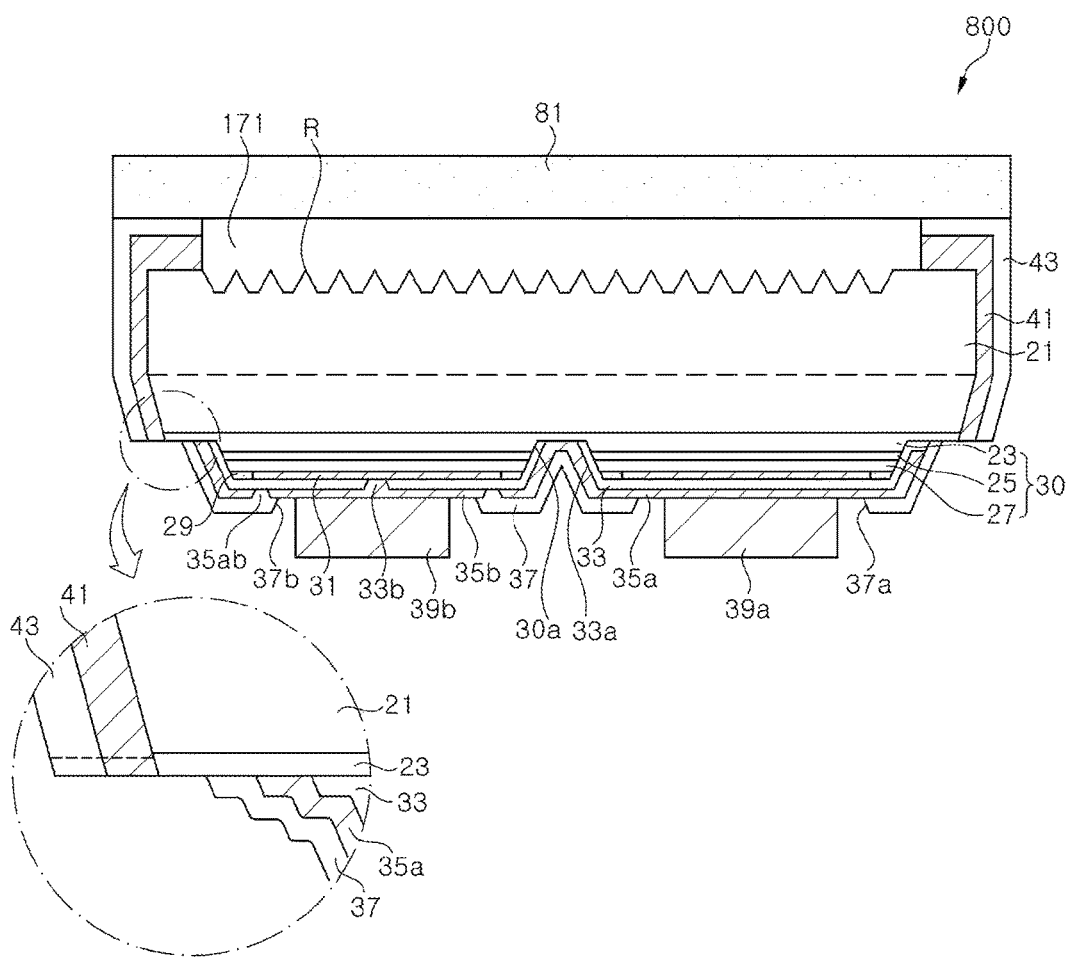
FIG. 22 is a cross-sectional view taken along line A-A of FIG. 21.

FIG. 21 is a schematic plan view of a light emitting diode 800 according to yet another exemplary embodiment seen from a side of bump pads 39a, 39b, and FIG. 22 is a cross-sectional view taken along line A-A of FIG. 21.

Referring to FIG. 21 and FIG. 22, the light emitting diode 800 includes a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, an upper insulation layer 37, a first bump pad 39a, a second bump pad 39b, a side reflection layer 41, and a protective layer 43. The light emitting diode 800 further includes a wavelength converter 81 and may include a bonding agent 171. The first conductivity type semiconductor layer 23, the active layer 25 and the second conductivity type semiconductor layer 27 constitute the semiconductor stack 30. The light emitting diode 800 may further include a ohmic oxide layer 29, which may be transparent.

The substrate 21, the first conductivity type semiconductor layer 23, the active layer 25, the second conductivity type semiconductor layer 27, the ohmic reflection layer 31, the lower insulation layer 33, the first pad metal layer 35a, the second pad metal layer 35b, the upper insulation layer 37, the first bump pad 39a and the second bump pad 39b are similar to those of the light emitting diode described with reference to FIG. 1 and FIG. 2, and detailed descriptions thereof will be omitted. In addition, a mesa M is disposed on the first conductivity type semiconductor layer 23 and is also similar to the mesa M described with reference to FIG. 1 and FIG. 2. Thus, detailed description thereof will also be omitted.

In this exemplary embodiment, the side reflection layer 41 is disposed on side surfaces of the substrate 21. The side reflection layer 41 covers not only the perpendicular side surface of the substrate 21 but also the inclined side surface thereof. The side reflection layer 41 may also cover the side surface of the first conductivity type semiconductor layer 23. The side reflection layer 41 may be formed to cover all four side surfaces of the substrate 21, but is not limited thereto. Alternatively, the side reflection layer 41 may be formed to cover one to three side surfaces of the substrate 21.

As shown in FIG. 22, a portion of the side reflection layer 41 may cover an upper surface of the substrate 21 along an edge of the substrate 21. The portion of the side reflection layer 41 disposed on the upper surface of the substrate 21 may be placed on a flat surface of the substrate 21 and the roughness R may be placed only in a region surrounded by the side reflection layer 41.

As shown in an enlarged circle of FIG. 22, the side reflection layer 41 is separated from the first pad metal layer 35a in the lateral direction. Particularly, the side reflection layer 41 may be disposed above an upper surface of the mesa M and thus is placed above the exposed surface of the first conductivity type semiconductor layer 23 around the mesa M. For example, a lower end of the side reflection layer 41 may be flush with the exposed surface of the first conductivity type semiconductor layer 23 or may be placed above the exposed surface of the first conductivity type semiconductor layer 23, as indicated by a dotted line. Accordingly, a portion of the exposed surface of the first conductivity type semiconductor layer 23 around the mesa M may be exposed to the outside between the side reflection layer 41 and the upper insulation layer 37.

The side reflection layer 41 may include a metal reflection layer of Ag or Al and a barrier layer formed of, for example, Ni and/or Ti may be disposed on the metal reflection layer. Further, an anti-oxidation layer such as an Au layer may be disposed on the barrier layer in order to prevent oxidation of the metal reflection layer. Furthermore, a bonding layer such as a Ni layer or a Ti layer may be interposed between the metal reflection layer and the substrate 21 in order to improve bonding characteristics of the metal reflection layer. The side reflection layer 41 may form ohmic contact or Schottky contact with the substrate 21 and the first conductivity type semiconductor layer 23.

For example, the side reflection layer 41 may have a multilayer structure of Ni/Ag/Ni/Ti/Au, Ni/Ag/Ni/Mo/Ni/Mo, Ag/Ni/Mo/Ag/SiO$_2$, or the like. It should be noted that the side reflection layer 41 is not limited to the metal reflection layer. The side reflection layer 41 may further include a distributed Bragg reflector, or may further include an omnidirectional reflector (ODR) including a transparent oxide layer between the metal reflection layer and the substrate 21.

With the side reflection layer 41 disposed only on the side surfaces of the substrate 21 and the first conductivity type semiconductor layer 23, the side reflection layer 41 can be prevented from directly contacting (short circuiting) the first pad metal layer 35a, thereby preventing electrical interference by the side reflection layer 41.

When the side reflection layer 41 includes the metal reflection layer overlapping the first pad metal layer 35a, the side reflection layer 41 can be directly electrically connected to the first pad metal layer 35a through defects such as pin holes or cracks in the upper insulation layer 37. In this case, electrical characteristics of the light emitting diode, such as forward voltage, can be significantly changed depending upon the presence of contact between the side reflection layer 41 and the first pad metal layer 35a, thereby causing significant deviation in electrical characteristics between light emitting diodes. On the contrary, according to this exemplary embodiment, the side reflection layer 41 is separated from the mesa M and the first pad metal layer 35a, thereby enabling mass production of light emitting diodes with less deviation in electrical characteristics.

The protective layer 43 is disposed on the side reflection layer 41. The protective layer 43 covers the side reflection layer 41 to prevent a wide area of the side reflection layer 41 from being exposed to the outside. The protective layer 43 may also cover a portion of the side reflection layer 41 covering the edge of the substrate 21.

The protective layer 43 may be formed of, for example, an insulation material such as SiO$_2$, Si$_3$N$_4$ or TiO$_2$, or a conductive material such as indium tin oxide (ITO). The insulation layer protects the side reflection layer 41 by preventing a solder from coupling with the side reflection layer 41. In addition, the conductive layer such as an ITO layer exhibits poor wettability with respect to the solder to prevent the solder from moving towards the side surface of the light emitting diode 100.

As shown in FIG. 22, the protective layer 43 has substantially the same shape as the side reflection layer 41. As shown in an enlarged circle of FIG. 22, a lower end of the protective layer 43 is also separated from the first pad metal layer 35a and the mesa M in the lateral direction, as in the side reflection layer 41. Particularly, the lower end of the protective layer 43 may be flush with the lower end of the side reflection layer 41.

The protective layer 43 may have any thickness so long as the protective layer can prevent infiltration of the solder. For example, the thickness of the protective layer 43 may be smaller or larger than the thickness of the side reflection layer 41.

The wavelength converter 81 is disposed on the substrate 21. The wavelength converter 81 may be formed on the substrate 21 using a mixture of a resin and phosphors. Alternatively, the wavelength converter 81 previously prepared may be attached to the substrate 21 or to the side reflection layer 41 or the protective layer 43 formed on the upper surface of the substrate 21 using a bonding agent 171.

The wavelength converter 81 may include a resin layer containing phosphors, a wavelength converting sheet or a ceramic plate phosphor, particularly phosphor-in-glass (PIG) or SiC phosphors. The ceramic plate phosphor can be used for a long period of time without discoloration even under high temperature conditions.

The wavelength converter 81 may include one or several kinds of phosphors. For example, the wavelength converter 81 may include phosphors that emit blue, green or red light in response to light generated from the active layer 25. When the active layer 25 emits blue light, white light can be realized through combination of light converted by the wavelength converter 81 and the light generated from the active layer 25.

Although the light emitting diode 100 configured to emit white light is described in this exemplary embodiment, it should be understood that other implementations are also possible and mixed light of various colors can be realized using the wavelength converter 81.

Figure 23:
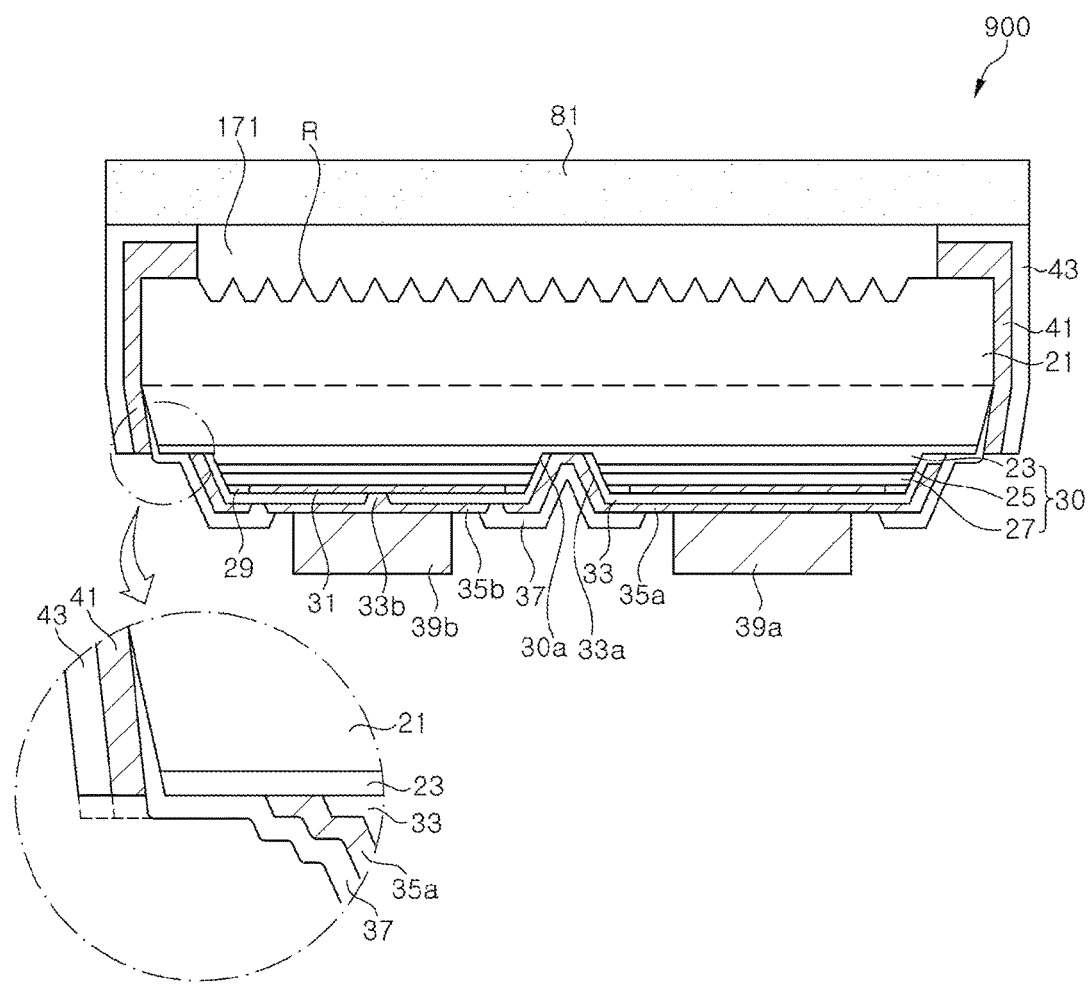
FIG. 23 is a schematic cross-sectional view of a light emitting diode according to yet another exemplary embodiment.

FIG. 23 is a schematic cross-sectional view of a light emitting diode 900 according to yet another exemplary embodiment.

Referring to FIG. 23, the light emitting diode 900 according to this exemplary embodiment is generally similar to the light emitting diode 100 described with reference to FIG. 21 and FIG. 22 except that the upper insulation layer 37 covers the inclined side surface of the substrate 21.

That is, the upper insulation layer 37 covers the entirety of the first conductivity type semiconductor layer 23 exposed around the mesa M, and also covers the side surface of the first conductivity type semiconductor layer 23 and the inclined side surface of the substrate 21. Here, the upper insulation layer 37 does not cover the perpendicular side surface of the substrate 21.

On the other hand, the side reflection layer 41 covers the perpendicular side surface of the substrate 21 and also covers the upper insulation layer 37 on the inclined side surface. In this structure, a lower end of the side reflection layer 41 may be flush with the exposed surface of the first conductivity type semiconductor layer 23 or may be disposed below the exposed surface of the first conductivity type semiconductor layer 23, as indicated by a dotted line. Here, the lower end of the side reflection layer 41 may be flush with or disposed above a horizontal plane of the upper insulation layer 37.

Figure 24:
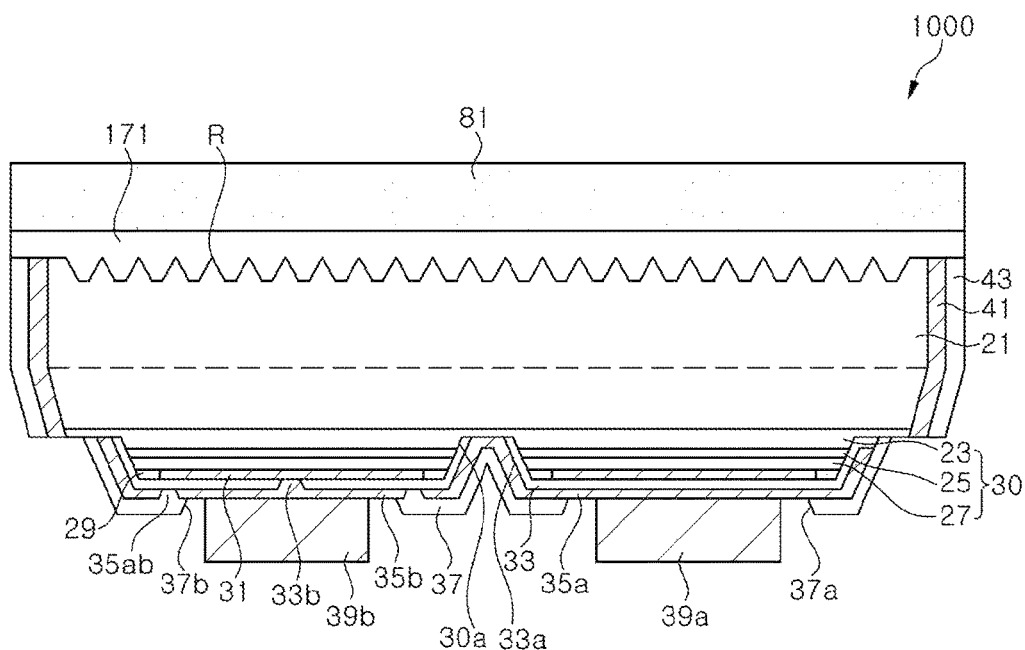
FIG. 24 is a schematic cross-sectional view of a light emitting diode according to yet another exemplary embodiment.

FIG. 24 is a schematic cross-sectional view of a light emitting diode 1000 according to yet another exemplary embodiment.

Referring to FIG. 24, the light emitting diode 1000 according to this exemplary embodiment is generally similar to the light emitting diode 100 described with reference to FIG. 21 and FIG. 22 except for the locations of the side reflection layer 41 and the protective layer 43. That is, in the exemplary embodiment shown in FIG. 21 and FIG. 22, the side reflection layer 41 covers a portion of the upper surface of the substrate 21, whereas the side reflection layer 41 does not cover the upper surface of the substrate 21 in this exemplary embodiment. Thus, an upper end of the side reflection layer 41 may be flush with the upper surface of the substrate 21, or may be disposed below the upper surface thereof. The protective layer 43 does not cover the upper surface of the substrate 21, too, and an upper end of the protective layer 43 may be flush with or disposed below the upper surface of the substrate 21.

The viewing angle of the light emitting diode can be adjusted by adjusting the location of the side reflection layer 41. That is, with the structure wherein the side reflection layer 41 covers the upper surface of the substrate 21 as in the exemplary embodiment of FIG. 21, the viewing angle of the light emitting diode can be further reduced, and with the structure wherein the side reflection layer 41 is disposed only on the side surface of the substrate 21 as in this exemplary embodiment, the viewing angle of the light emitting diode can be greater than the viewing angle of the light emitting diode shown in FIG. 21.

Figure 25:
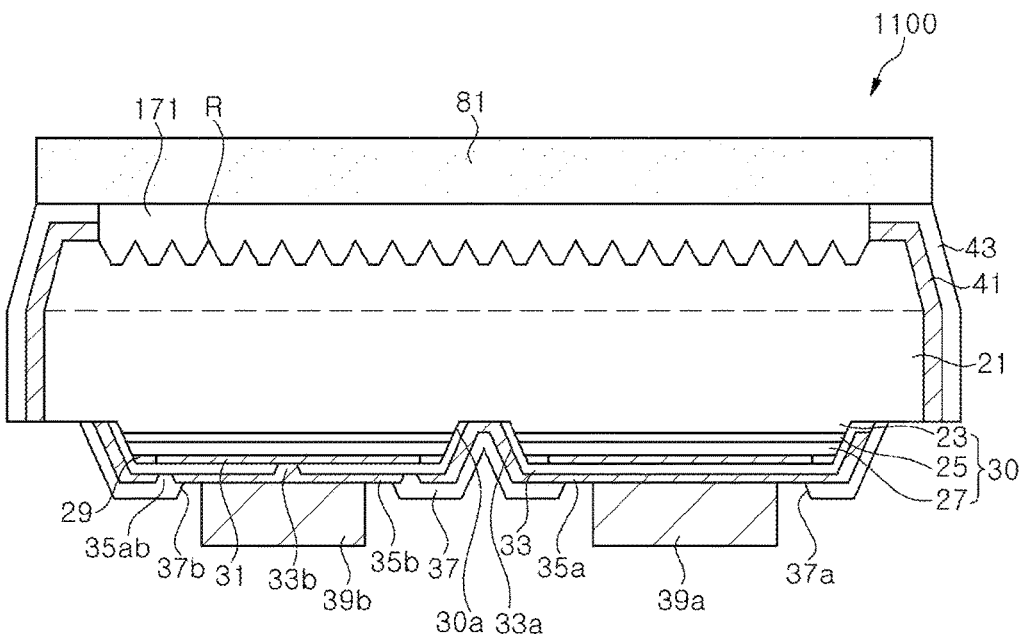
FIG. 25 is a schematic cross-sectional view of a light emitting diode according to yet another exemplary embodiment.

FIG. 25 is a schematic cross-sectional view of a light emitting diode 1100 according to yet another exemplary embodiment.

Referring to FIG. 25, the light emitting diode 1100 according to this exemplary embodiment is generally similar to the light emitting diode 100 described with reference to FIG. 21 and FIG. 22 except for the locations of the perpendicular side surface and the inclined side surface of the substrate 21. That is, in the exemplary embodiment shown in FIG. 21 and FIG. 22, the inclined side surface of the substrate 21 is closer to the bump pads 39a, 39b than the perpendicular side surface, whereas, in this exemplary embodiment, the inclined side surface of the substrate 21 is closer to the upper surface of the substrate 21 than the perpendicular side surface. Furthermore, according to this exemplary embodiment, the inclined side surface of the substrate 21 may be flush with the upper surface of the substrate 21.

The side reflection layer 41 may cover the perpendicular side surface and the inclined side surface of the substrate 21 and also partially cover the upper surface of the substrate 21 along an edge thereof. Furthermore, the protective layer 43 is dispose on the side reflection layer 41 to cover the side reflection layer 41.

Figure 26:
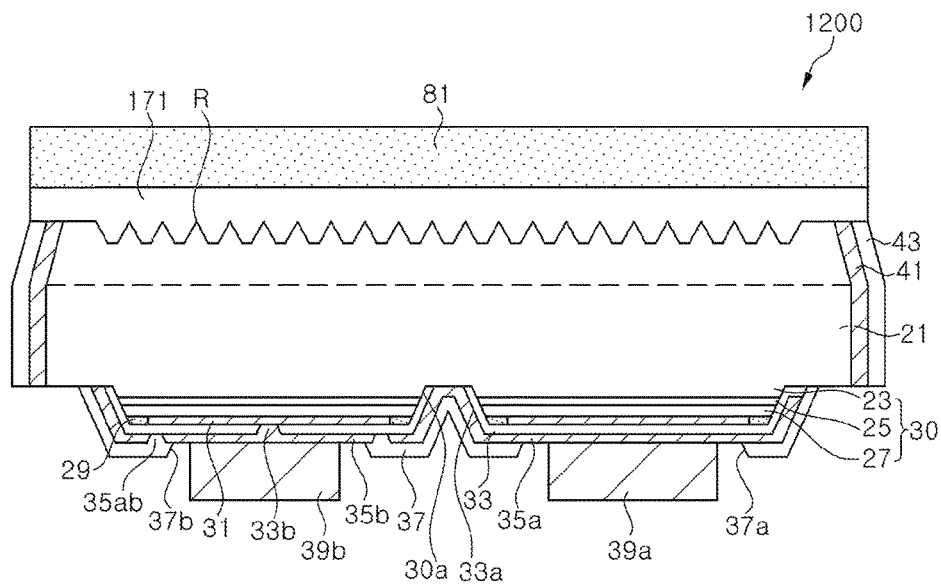
FIG. 26 is a schematic cross-sectional view of a light emitting diode according to yet another exemplary embodiment.

FIG. 26 is a schematic cross-sectional view of a light emitting diode 1200 according to yet another exemplary embodiment.

Referring to FIG. 26, the light emitting diode 1200 according to this exemplary embodiment is generally similar to the light emitting diode 1100 described with reference to FIG. 25 except for the locations of the side reflection layer 41 and the protective layer 43. That is, in the exemplary embodiment of FIG. 25, the side reflection layer 41 partially covers the upper surface of the substrate 21, whereas, in this exemplary embodiment, the side reflection layer 41 does not cover the substrate 21. Accordingly, the upper end of the side reflection layer 41 is flush with or disposed below the upper surface of the substrate 21. The protective layer 43 does not cover the upper surface of the substrate 21, too, and the upper end of the protective layer 43 is flush with or disposed below the upper surface of the substrate 21.

Figure 27:
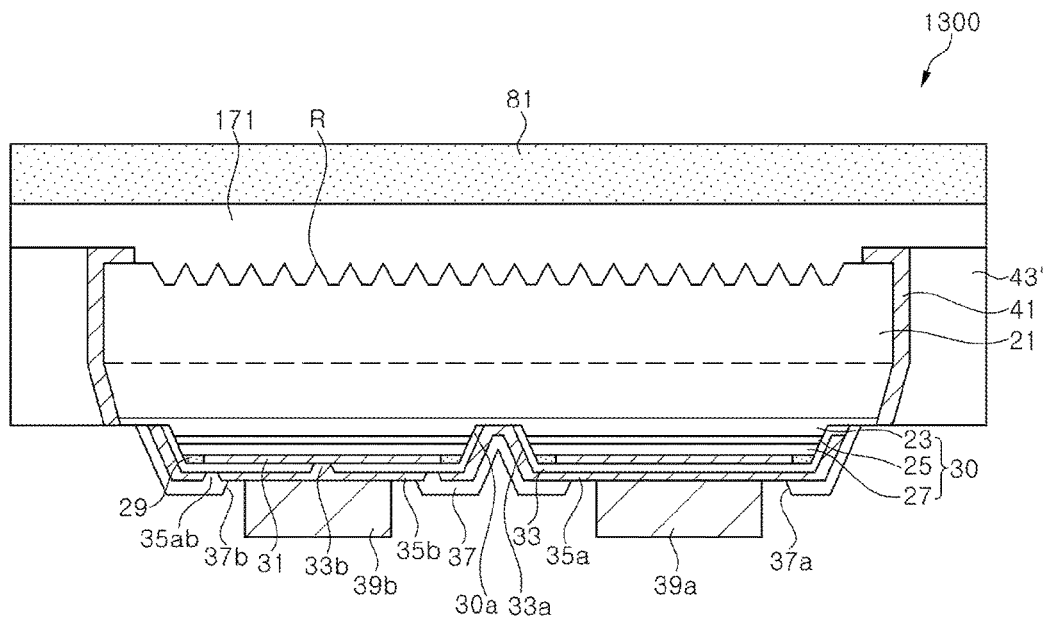
FIG. 27 is a schematic cross-sectional view of a light emitting diode according to yet another exemplary embodiment.

FIG. 27 is a schematic cross-sectional view of a light emitting diode 1300 according to yet another exemplary embodiment.

Referring to FIG. 27, the light emitting diode 1300 according to this exemplary embodiment is generally similar to the light emitting diode 100 described with reference to FIG. 21 and FIG. 22 except that a protective layer 43' is formed of a resin. In this embodiment, the resin layer 43' covers the side reflection layer 41. The resin layer 43' may be thicker than the protective layer 43 and thus can be used as a support member of the light emitting diode. Since the resin layer 43' is relatively thick, the resin layer can prevent a solder from covering the side surface of the light emitting diode 1300.

The resin layer 43' may include an epoxy resin, a silicone resin, an epoxy molding compound (EMC), or a silicone molding compound (SMC). In addition, the resin layer 43' may be a white barrier layer. In this embodiment, the white barrier layer 43' may be formed by mixing, for example, $TiO_2$ with a silicone resin, an epoxy resin, EMC, or SMC. The white barrier layer 43' can have defects such as cracks therein over time. Thus, in a structure wherein the white barrier layer 43' is directly formed on the side surface of the light emitting diode 1300 without the side reflection layer 41, the light emitting diode can suffer from light leakage through the white barrier layer 43'. However, according to the exemplary embodiments, the side reflection layer 41 is formed on the side surface of the light emitting diode 1300, thereby providing a light emitting device that does not suffer from light leakage even after use for a long period of time.

The wavelength converter 81 may be attached to the upper surface of the substrate 21 using a bonding agent 171. As shown in FIG. 27, the wavelength converter 81 may be disposed above the resin layer 43', but is not limited thereto. Alternatively, the resin layer 43' may cover a side surface of the wavelength converter 81.

Figure 28A:
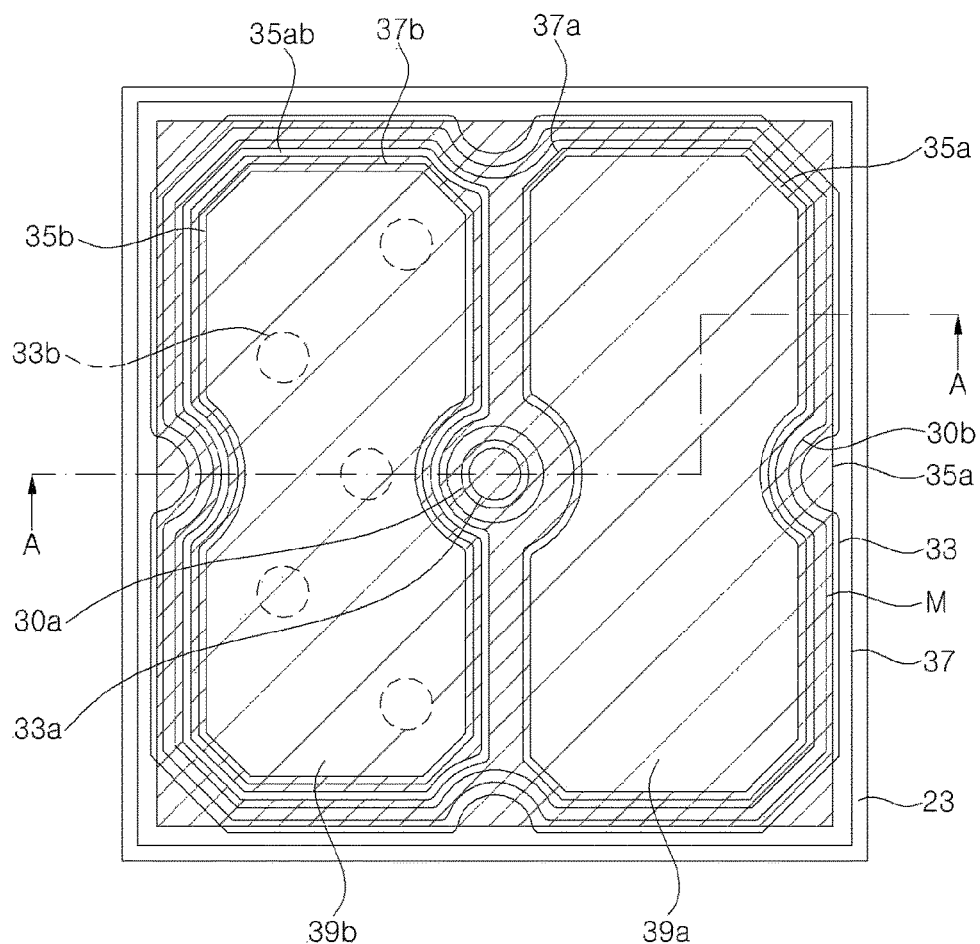
FIG. 28A, FIG. 28B, FIG. 29A, FIG. 29B, FIG. 29C, FIG. 29D, and FIG. 29E are schematic plan views and cross-sectional views illustrating a method of manufacturing a light emitting diode according to another exemplary embodiment.
Figure 28B:
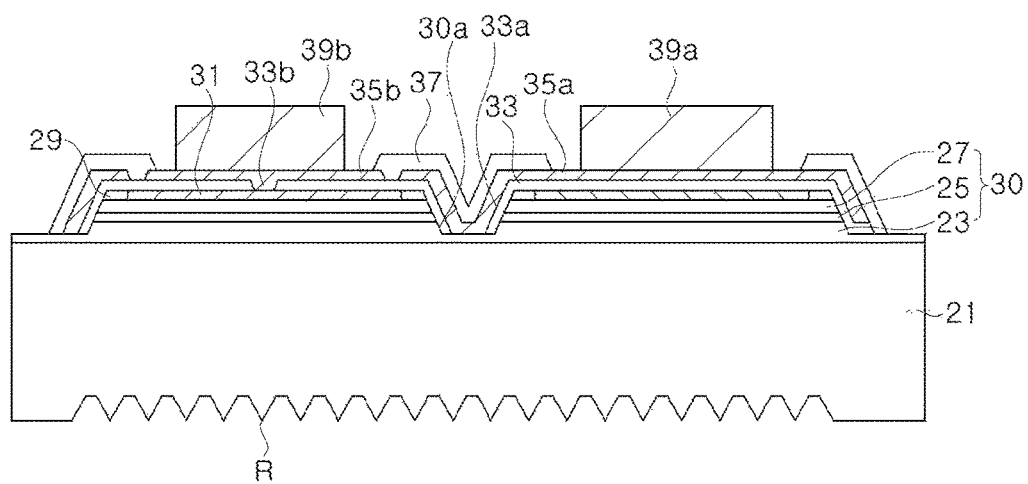

FIG. 28 and FIG. 29 are plan views and cross-sectional views illustrating a method of manufacturing a light emitting diode 800 according to another exemplary embodiment. FIG. 28A is a plan view and FIG. 28B is a cross-sectional view taken along line A-A of FIG. 28A.

First, a semiconductor stack 30 including a first conductivity type semiconductor layer 23, an active layer 25 and a second conductivity type semiconductor layer 27, an ohmic oxide layer 29, a mesa M, an ohmic reflection layer 31, a lower insulation layer 33, a first pad metal layer 35a, a second pad metal layer 35b, an upper insulation layer 37, a first bump pad 39a, and a second bump pad 39b are formed on a substrate 21 through the processes described with reference to FIG. 10A, FIG. 10B, FIG. 11A, FIG. 11B, FIG. 12A, FIG. 12B, FIG. 13A, FIG. 13B, FIG. 14A, FIG. 14B, FIG. 15A and FIG. 15B.

Referring to FIG. 28A and FIG. 28B, after formation of the first and second bump pads 39a, 39b, a lower surface of the substrate 21 is subjected to grinding to reduce the thickness of the substrate 21 and a roughness R is formed on the ground lower surface of the substrate 21. The lower surface of the substrate 21 may be ground by lapping and/or polishing and the roughness R may be formed by dry and wet etching.

The roughness R may be formed over the entirety of the substrate 21 or may be formed in a particular region on the substrate 21, as described with reference to FIG. 16A and FIG. 16B. A mask may be used to define a region in which the roughness R will be formed. A flat surface may be formed around the region in which the roughness R is formed.

Herein, the roughness R may have any height, for example, a height of 1 μm or more. The roughness R may be omitted.

Next, a method of forming the side reflection layer 41 and the protective layer 43 on the side surface of the substrate 21 will be described with reference to FIG. 29. Although FIG. 29 shows two light emitting diode regions formed by the processes described with reference to FIG. 28A and FIG. 28B, a larger number of light emitting diode regions may be formed on the substrate 21, and the mesa M and the bump pads 39a, 39b may be formed on each of the light emitting diode regions.

Figure 29A:
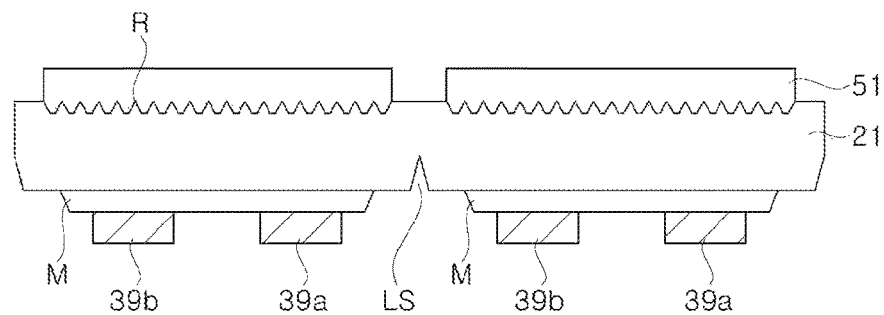

Referring to FIG. 29A, after formation of the first and second bump pads 39a, 39b, a scribing line LS is formed from the first conductivity type semiconductor layer 23 side into the substrate 21. The scribing line LS corresponds to an isolation region between light emitting diodes and thus a plurality of scribing lines LS may be formed in a mesh shape on the substrate 21.

In addition, a masking material in the form of a photoresist pattern 51 is formed on the substrate 21 having the roughness R thereon. The photoresist pattern 51 may be formed on the substrate 21 by forming a photoresist layer on the substrate 21 through spin coating or the like, followed by patterning the photoresist layer through photolithography and development. As a result, flat regions on the upper surface of the substrate 21 can be exposed.

Figure 29B:
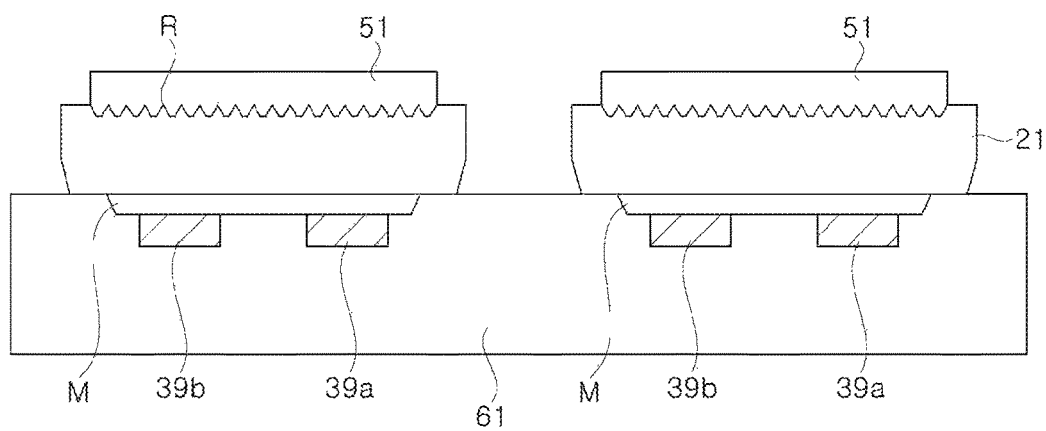

Referring to FIG. 29B, individual light emitting diode regions are divided from each other on a stretchable tape such as a blue tape, which in turn is stretched to separate the individual light emitting diode regions from each other. Thereafter, the divided individual light emitting diode regions are transferred to a support in the form of UV curable tape 61 such that the individual light emitting diodes can be attached thereto. Here, the mesa M may be embedded in the tape 61 such that the first conductivity type semiconductor layer 23 exposed around the mesa M can adjoin an upper surface of the tape 61. However, it should be understood that other implementations are also possible. A contact region between the light emitting diode regions and the support 61 may be adjusted and the first conductivity type semiconductor layer 23 may be partially embedded in the tape 61 in the thickness direction.

The side surface of the substrate 21 in each of the individual light emitting diode regions may have an inclined side surface formed by scribing and a perpendicular side surface formed by breaking.

Figure 29C:
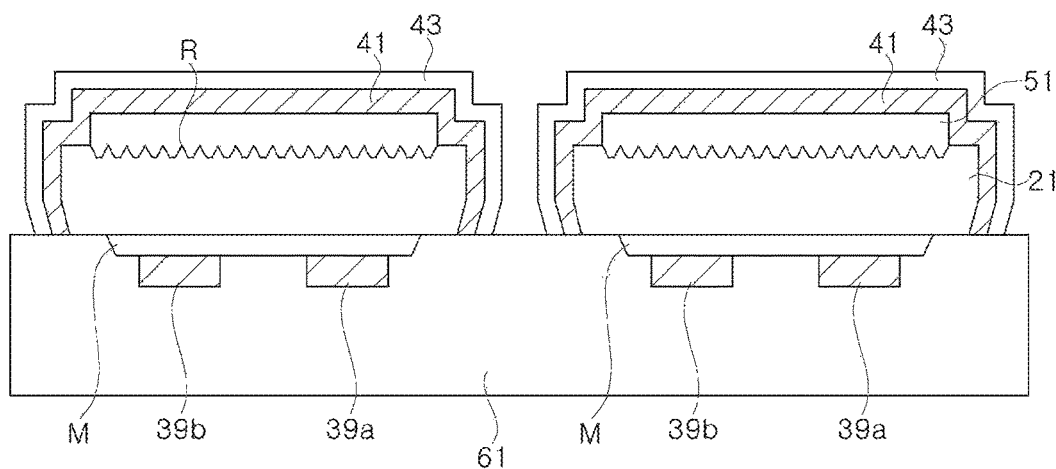

Referring to FIG. 29C, the side reflection layer 41 is deposited on each of the individual light emitting diode regions. The side reflection layer 41 may be deposited thereon by, for example, sputtering. The side reflection layer 41 includes a metal reflection layer such as an Ag layer or an Al layer. The side reflection layer 41 is the same as the side reflection layer described with reference to FIG. 21 and FIG. 22 and detailed description thereof will be omitted.

The side reflection layer 41 is formed on the side surface of the substrate 21 to have a substantially uniform thickness on the inclined side surface and the perpendicular side surface. The side reflection layer 41 covers the photoresist pattern 51 and the upper surface of the substrate 21 exposed through the photoresist pattern 51.

After deposition of the side reflection layer 41, the protective layer 43 is continuously deposited thereon. The protective layer 43 may be an insulation layer or a conductive oxide layer and may be formed by, for example, sputtering or CVD.

Since the exposed surface of the first conductivity type semiconductor layer 23 is shielded by the tape 61, the side reflection layer 41 or the protective layer 43 is prevented from being formed on the exposed surface of the first conductivity type semiconductor layer 23. Therefore, the side reflection layer 41 can be prevented from overlapping the first pad metal layer 35a.

Figure 29D:
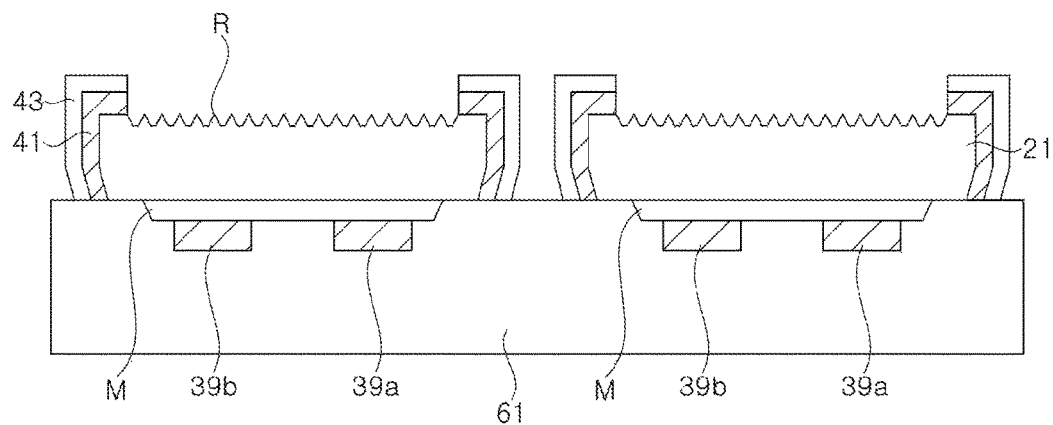

Referring to FIG. 29D, the reflection material layer and the protection material layer can be removed together with the photoresist layer from the upper surface of the substrate 21 excluding the side reflection layer 41 formed on the side and upper surfaces of the substrate 21 by removing the photoresist pattern 51. As a result, the side reflection layer 41 and the protective layer 43 covering the side surface and a portion of the upper surface of the substrate 21 can be formed.

Figure 29E:
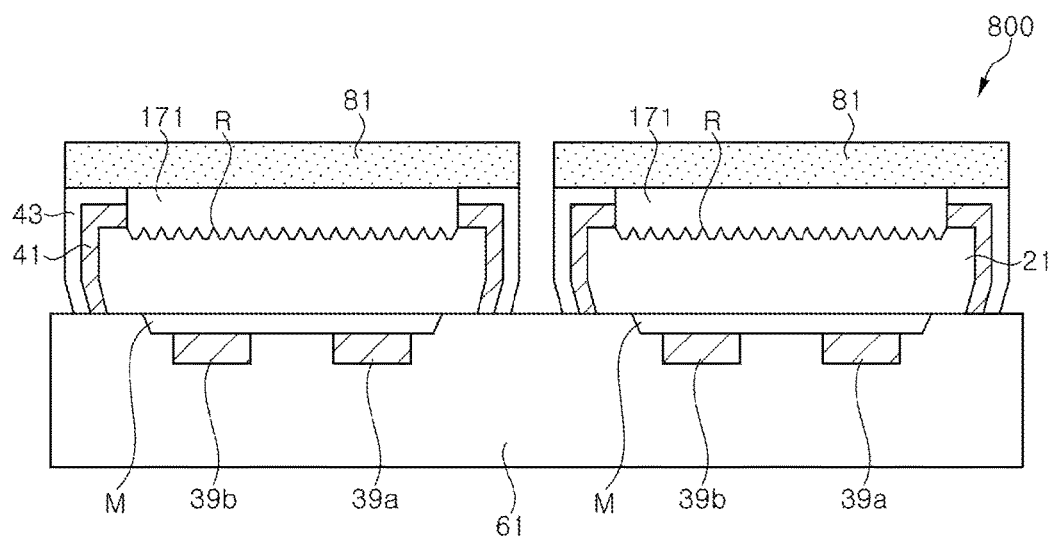

Referring to FIG. 29E, a wavelength converter 81 is attached to the upper surface of the substrate 21. The wavelength converter 81 may be attached to the substrate via a bonding agent 171, or may be bonded to the protective layer 43 formed on the upper surface of the substrate 21. Then, the individual light emitting diodes are separated from the tape 61, thereby providing the light emitting diodes 800 as shown in FIG. 21.

Although the scribing line LS is formed using a laser in this exemplary embodiment, the scribing line LS may be formed using a blade. In this case, the inclined side surface of the substrate 21 may be formed to have a gentler inclination.

In addition, although the scribing line LS is formed after formation of the first and second bump pads 39a, 39b in this exemplary embodiment, the scribing line LS may also be formed before formation of the upper insulation layer 37. In this case, the upper insulation layer 37 may be formed inside the scribing line LS, thereby providing the light emitting diode 900 as shown in FIG. 23.

In this exemplary embodiment, the photoresist pattern 51 is formed to expose a region of the upper surface of the upper surface of the substrate 21 along an edge thereof. Alternatively, the photoresist pattern 51 may be formed to cover the entirety of the upper surface of the substrate 21, thereby providing the light emitting diode 1000 as shown in FIG. 24.

In addition, although the scribing line LS is formed on the lower surface of the substrate 21, that is, on the bump pads 39a, 39b side in the above exemplary embodiments, the scribing line LS may be formed on the upper surface of the substrate 21, thereby providing the light emitting diodes 1100, 1200 as shown in FIG. 25 and FIG. 26.

Although the protective layer 43 is formed using the insulation material or the conductive oxide material in this exemplary embodiment, the protective layer 43 may also be formed using a resin, thereby providing the light emitting diode 1300 as shown in FIG. 27.

In this exemplary embodiment, the side reflection layer 41 and the protective layer 43 are removed from the upper surface of the substrate 21 using the photoresist pattern 51 or the masking material. However, it should be understood that various techniques such as peeling off may be used to remove the side reflection layer 41 and the protective layer 43 from the upper surface of the substrate 21.

Figure 30:
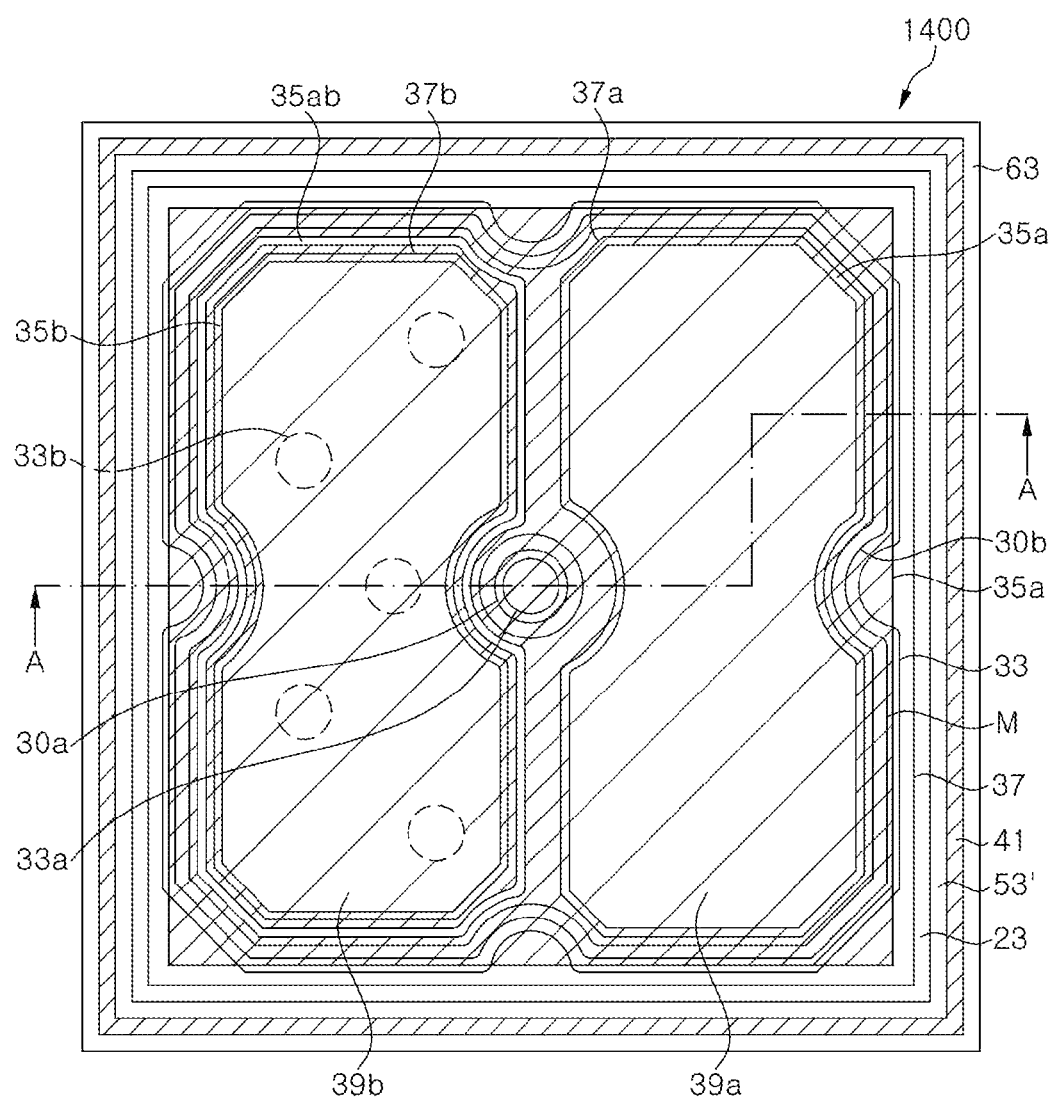
FIG. 30 is a schematic cross-sectional view of a light emitting diode according to yet another exemplary embodiment.
Figure 31:
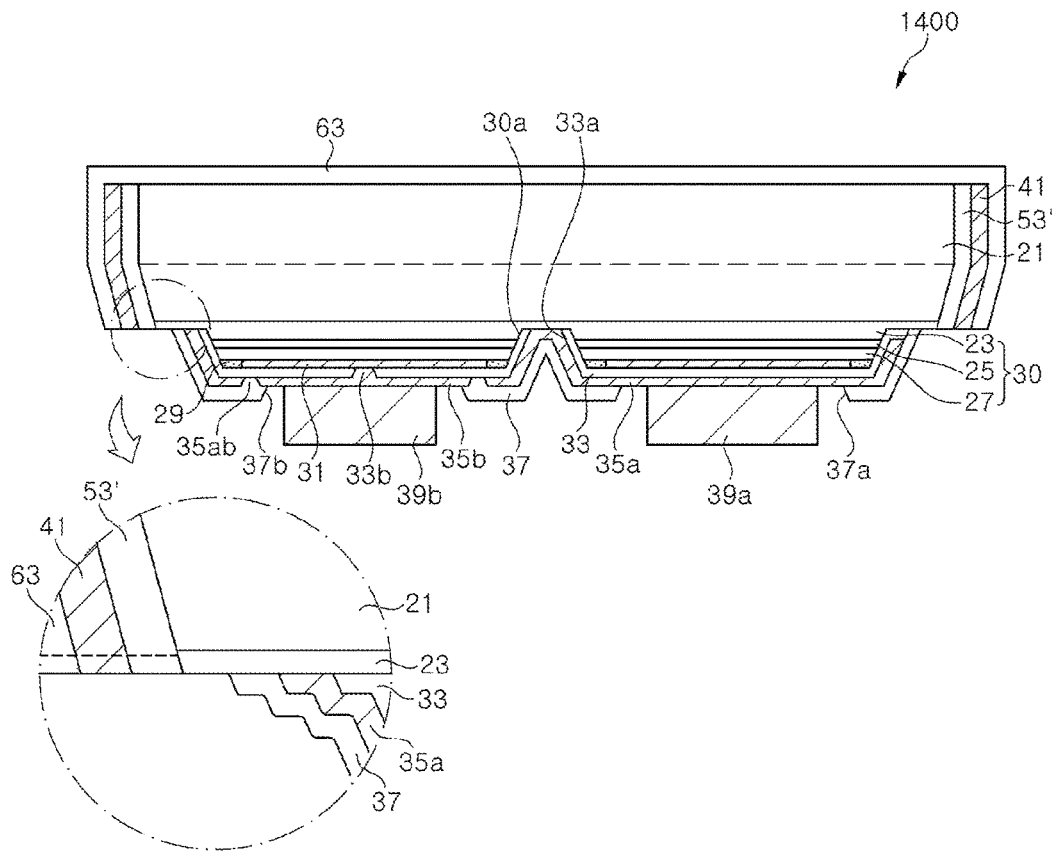
FIG. 31 is a cross-sectional view taken along line A-A of FIG. 30.
Figure 32A:
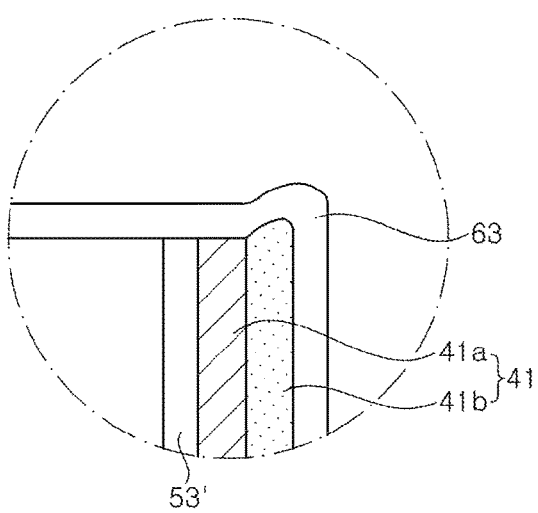
FIG. 32A and FIG. 32B are partially enlarged cross-sectional views illustrating various examples of the light emitting diode shown in FIG. 30.
Figure 32B:
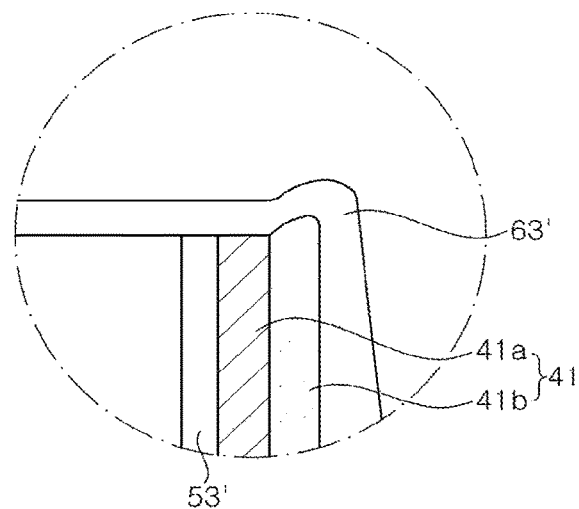

FIG. 30 is a schematic cross-sectional view of a light emitting diode 1400 according to yet another exemplary embodiment, FIG. 31 is a cross-sectional view taken along line A-A of FIG. 30, and FIG. 32A and FIG. 32B are partially enlarged cross-sectional views illustrating various examples of the light emitting diode shown in FIG. 30.

First, referring to FIG. 30 and FIG. 31, the light emitting diode 1400 according to this exemplary embodiment includes a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, an upper insulation layer 37, a first bump pad 39a, a second bump pad 39b, a light transmitting material layer 53', a side reflection layer 41, and a capping layer 63. As described with reference to FIG. 22, the light emitting diode 1400 may include a wavelength converter and a bonding agent 171. The first conductivity type semiconductor layer 23, the active layer 25 and the second conductivity type semiconductor layer 27 constitute a semiconductor stack 30. The light emitting diode 1300 may further include an ohmic oxide layer 29, which may be transparent.

The substrate 21, the first conductivity type semiconductor layer 23, the active layer 25, the second conductivity type semiconductor layer 27, the ohmic reflection layer 31, the lower insulation layer 33, the first pad metal layer 35a, the second pad metal layer 35b, the upper insulation layer 37, the first bump pad 39a and the second bump pad 39b are similar to those of the light emitting diode described with reference to FIG. 1 and FIG. 2, and detailed descriptions thereof will be omitted for clarity. In addition, a mesa M is disposed on the first conductivity type semiconductor layer 23 and is also similar to the mesa M described with reference to FIG. 1 and FIG. 2. Thus, detailed description thereof will also be omitted.

In this exemplary embodiment, the substrate 21 may have a flat upper surface and the roughness R may be omitted. However, it should be understood that other implementations are also possible and the roughness R may be formed on the entirety or part of the upper surface of the substrate 21.

The light transmitting material layer 53' and the side reflection layer 41 are disposed on side surfaces of the substrate 21. The light transmitting material layer 53' and the side reflection layer 41 cover not only the perpendicular side surface of the substrate 21 but also the inclined side surface thereof. The light transmitting material layer 53' and the side reflection layer 41 may also cover the side surface of the first conductivity type semiconductor layer 23. The light transmitting material layer 53' and the side reflection layer 41 may be formed to cover all four side surfaces of the substrate 21, but are not limited thereto. Alternatively, the light transmitting material layer 53' and the side reflection layer 41 may be formed to cover one to three side surfaces of the substrate 21.

The light transmitting material layer 53' may be formed of the same material as the roughness relieving layer 53 described with reference to FIG. 1 and FIG. 2. For example, the light transmitting material layer 53' may be formed of a conductive oxide material such as ITO or ZnO, or an insulation material such as $SiO_2$, $SiN_x$ or SiON. In this exemplary embodiment, the light transmitting material layer 53' may have a thickness of 50 nm or less, specifically 20 nm or less. The light transmitting material layer 53' may have a thickness of, for example, about 10 nm.

The light transmitting material layer 53' can be used to enhance bonding strength of the side reflection layer 41 and can relieve roughness of the side surface of the substrate 21. Furthermore, the light transmitting material layer 53' is interposed between the side reflection layer 41 and the substrate 21, thereby forming an omnidirectional reflector (ODR).

The side reflection layer 41 is disposed on the side surface of the substrate 21 and separated from the upper surface of the substrate 21. Accordingly, light traveling towards the upper surface of the substrate 21 can be discharged to the outside without being reflected by the side reflection layer 41.

As shown in an enlarged circle of FIG. 31, the side reflection layer 41 is separated from the first pad metal layer 35a in the lateral direction. Particularly, the side reflection layer 41 may be disposed above an upper surface of the mesa M and thus may be disposed above the exposed surface of the first conductivity type semiconductor layer 23 around the mesa M. For example, a lower end of the side reflection layer 41 may be flush with the exposed surface of the first conductivity type semiconductor layer 23 or may be placed above the exposed surface of the first conductivity type semiconductor layer 23, as indicated by a dotted line. Accordingly, a portion of the exposed surface of the first conductivity type semiconductor layer 23 around the mesa M may be exposed to the outside between the side reflection layer 41 and the upper insulation layer 37. Like the side reflection layer 41, the light transmitting material layer 53' and the capping layer 63 are separated from the first pad metal layer 35a in the lateral direction, and may be placed above the exposed surface of the first conductivity type semiconductor layer 23 around the mesa M.

Referring to FIG. 32A, the side reflection layer 41 may include a metal reflection layer 41a of Ag or Al and a barrier layer 41b such as Ni and/or Ti layers may be disposed on the metal reflection layer. Further, an anti-oxidation layer such as an Au layer may be disposed on the barrier layer in order to prevent oxidation of the metal reflection layer. Furthermore, the barrier layer may include Ni and Mo. The metal reflection layer 41a may have a thickness of 120 nm or more in order to exhibit sufficient reflection characteristics.

For example, the side reflection layer 41 may have a multilayer structure of Ag/Ni/Mo/Ni/Mo, Ag/Ni/Mo/Ag/$SiO_2$, or the like. It should be noted that the side reflection layer 41 is not limited to the metal reflection layer. The side reflection layer 41 may further include a distributed Bragg reflector, or may further include an omnidirectional reflector (ODR) including a transparent oxide layer between the metal reflection layer and the substrate 21.

With the side reflection layer 41 disposed only on the side surfaces of the substrate 21 and the first conductivity type semiconductor layer 23, the side reflection layer 41 can be prevented from directly contacting (short circuiting) the first pad metal layer 35a, thereby preventing electrical interference by the side reflection layer 41.

When the side reflection layer 41 includes the metal reflection layer overlapping the first pad metal layer 35a, the side reflection layer 41 can be directly electrically connected to the first pad metal layer 35a through defects such as pin holes or cracks in the upper insulation layer 37. In this case, electrical characteristics of the light emitting diode, such as forward voltage, can be significantly changed depending upon the presence of contact between the side reflection layer 41 and the first pad metal layer 35a, thereby causing significant deviation in electrical characteristics between light emitting diodes. On the contrary, according to this exemplary embodiment, the side reflection layer 41 is separated from the mesa M and the first pad metal layer 35a in the lateral direction, thereby enabling mass production of light emitting diodes with less deviation in electrical characteristics.

Furthermore, the upper end of the metal reflection layer 41a may be placed at a different location from the upper end of the barrier layer 41b. As shown in FIG. 32A and FIG. 32B, the upper end of the metal reflection layer 41a may be substantially flush with the upper surface of the substrate 21, whereas the upper end of the barrier layer 41b may be placed above the upper surface of the substrate 21.

The capping layer 63 is disposed on the side reflection layer 41 and covers the upper surface of the substrate 21. The capping layer 63 covers the side reflection layer 41 and the upper surface of the substrate 21 to protect the side reflection layer 41 from an external environment such as moisture, and firmly couples the side reflection layer 41 to the substrate 21 to prevent the side reflection layer 41 from being separated from the substrate 21. Particularly, during formation of the side reflection layer 41, a gap can be formed between an upper end of the side reflection layer 41 and the side surface of the substrate 21. The gap between the side reflection layer 41 and the substrate 21 can act as a peeling start point of the side reflection layer 41. The capping layer 63 can fill the gap between the side reflection layer 41 and the substrate 21 while covering the side reflection layer 41, thereby further preventing the side reflection layer 41 formed on the side surface of the substrate 21 from being separated from the substrate 21.

The capping layer 63 according to this exemplary embodiment is similar to the protective layer 43 described with reference to FIG. 21 and FIG. 22 except that the capping layer 63 covers the upper surface of the substrate 21.

The capping layer 63 may be formed of, for example, an insulation material such as a primer, spin-on-glass (SOG), $SiO_2$, $SiN_x$, SiON or $TiO_2$, or a conductive material such as ITO or ZnO. The insulation layer protects the side reflection layer 41 by preventing a solder from coupling with the side reflection layer 41. In addition, the conductive layer such as an ITO layer exhibits poor wettability with respect to the solder to prevent the solder from moving towards the side surface of the light emitting diode 100. Further, the capping layer 63 includes a material layer having a lower index of refraction than the substrate 21, thereby improving light emission through the upper surface of the substrate 21.

The capping layer 63 can have a height deviation near the edge of the upper surface of the substrate 21 due to the barrier layer 41b. Particularly, a portion of the capping layer 63 disposed at an outer periphery of the substrate 21 along the edge of the upper surface of the substrate 21 becomes thicker than a portion of the capping layer 63 disposed on the upper surface of the substrate 21. With this structure, when the wavelength converter 81 is bonded using a bonding agent 171 as in the above exemplary embodiments, the capping layer 63 can prevent the bonding agent from flowing to the side surface of the substrate 21.

The capping layer 63 is formed on the side and upper surfaces of the substrate 21 after removing the light transmitting material layer 53' formed on the upper surface of the substrate 21 and the side reflection layer 41 by a lift-off or peel-off process. The capping layer 63 may be formed by, for example, sputtering, e-beam deposition, spin coating, and the like.

As shown in FIG. 32A, the capping layer 63 disposed on the side surface of the substrate 21 may have a substantially uniform thickness, or may have a gradually decreasing thickness from the side surface of the substrate 21 to the lower surface of the substrate 21. For example, when the capping layer 63 is formed by sputtering or e-beam deposition, the thickness of the capping layer 63 formed on the upper surface of the substrate 21 is relatively large. Alternatively, as shown in FIG. 32B, a capping layer 63' may be gradually thickened from the side surface of the substrate 21 to the lower surface of the substrate 21. For example, when the capping layer is formed by depositing a silicone primer or spin-on-glass (SOG) through spin coating or the like, a portion of the capping layer 63' near the lower surface of the substrate 21 is thicker than a portion of the capping layer 63' near the upper surface of the substrate 21, as shown in FIG. 32B. Accordingly, when the white barrier layer 75 (for example, FIG. 20) covers the side surface of the light emitting diode, the capping layer 63' can prevent the wavelength converter 81 from being damaged due to penetration of moisture through an interface between the white barrier layer and the light emitting diode from the lower surface of the substrate 21. Furthermore, since the capping layer 63' has a large thickness on the lower surface of the substrate 21, a moisture penetration path from the lower surface of the substrate 21 to the side reflection layer 41 and the light transmitting material layer 53' becomes long, thereby preventing damage to the side reflection layer 41 or the light transmitting material layer 53' by moisture.

Figure 33:
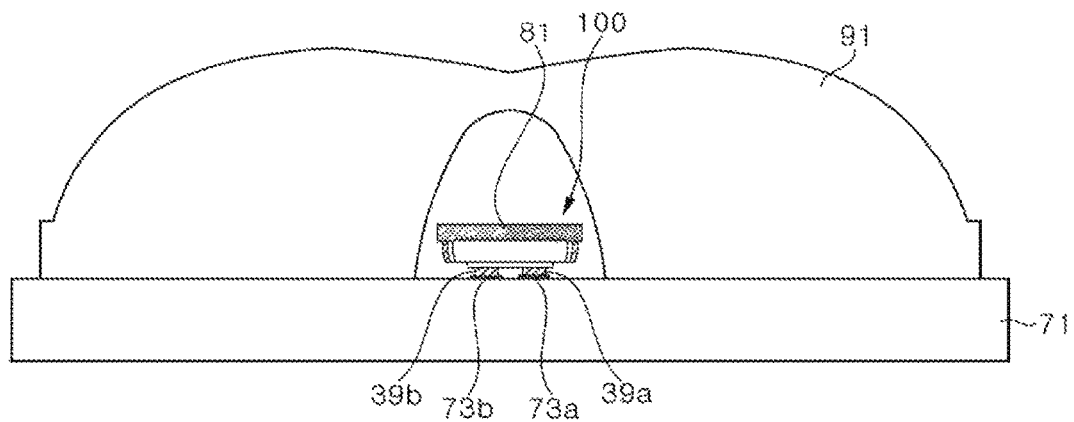
FIG. 33 is a schematic cross-sectional view of a light source module according to one exemplary embodiment.

FIG. 33 is a schematic cross-sectional view of a light source module according to one exemplary embodiment.

Referring to FIG. 33, the light source module includes a support substrate 71, a light emitting diode 100, a wavelength converter 81, and a lens 91. The light emitting diode 100 is the same as the light emitting diode described with reference to FIG. 1 and FIG. 2, and is flip bonded to the support substrate 71, on which the first and second pads 73a, 73b are disposed, via the first and second bump pads 39a, 39b. The support substrate 71 may be, for example, a printed circuit board.

The lens 91 is disposed above the light emitting diode 100. The lens 91 has a lower surface and an upper surface, in which the lower surface includes a concave portion receiving light emitted from the light emitting diode 100 and the upper surface has a light exit surface through which light exits the lens. The concave portion of the lower surface may be surrounded by a flat surface.

In addition, the upper surface of the lens 91 may include a concave portion placed at the center thereof and a convex portion placed around the concave portion. The convex portion may be formed to surround the concave portion.

The lens 91 is a diffusion lens configured to spread light, but is not limited thereto. Alternatively, the lens 91 having various shapes may be coupled to the light emitting diode 100 to realize various light patterns.

Although the light emitting diode 100 is flip bonded to the support substrate 71 in the light source module according to this exemplary embodiment, other light emitting diodes 200, 300, 400, 500, 600, 700, 800, 900, 1000, 1100, 1200, or 1300 may also be mounted on the support substrate 71.

The light emitting module according to this exemplary embodiment may be applied to, for example, a large TV or a camera flash.

Figure 34:
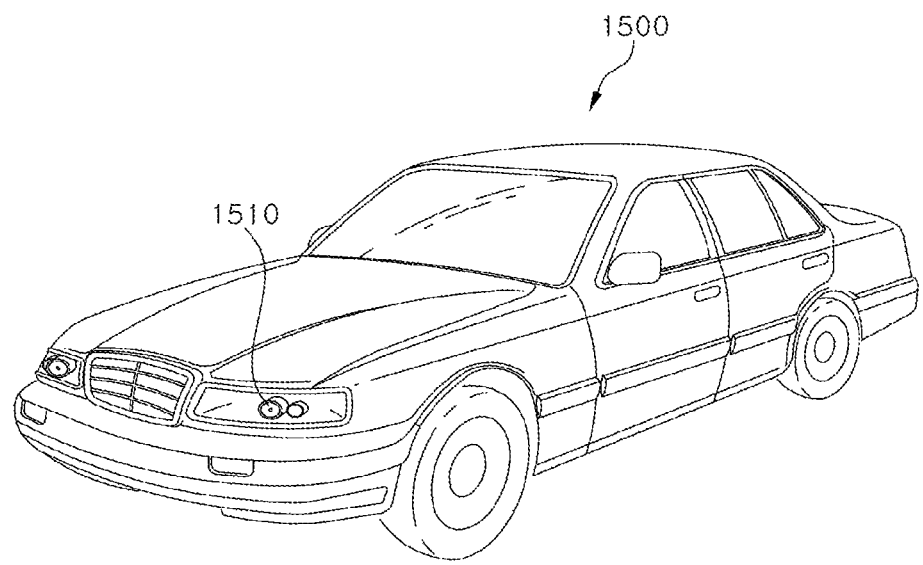
FIG. 34 is a schematic perspective view of an automobile including headlamps to which light emitting diodes according to exemplary embodiments are applied.

FIG. 34 is a schematic perspective view of an automobile 1500 including headlamps 1510 to which light emitting diodes according to exemplary embodiments are applied.

Referring to FIG. 33, the light emitting diode 100, 200, 300, 400, 500, 600, 700, 800, 900, 1000, 1100, 1200, or 1300 according to the exemplary embodiments is provided to the headlamps 1510 mounted on the front side of the automobile 1500. In this exemplary embodiment, the headlamps 1510 include fog lamps and headlamps for securing a forward view of a driver in day or at night.

The headlamps 1510 may be mounted on both front sides of the automobile 1500 and may have various shapes according to driver preference. In addition, the headlamps 1510 mounted on both front sides of the automobile 1500 may have a symmetrical structure with respect to each other or may have different structures.

The light emitting diode may be provided to the headlamps 1510 in the form of the light emitting module as described with reference to FIG. 20. However, it should be understood that other implementations are also possible and the light emitting diode may be provided in the form of various shapes of light emitting modules.

Figure 35:
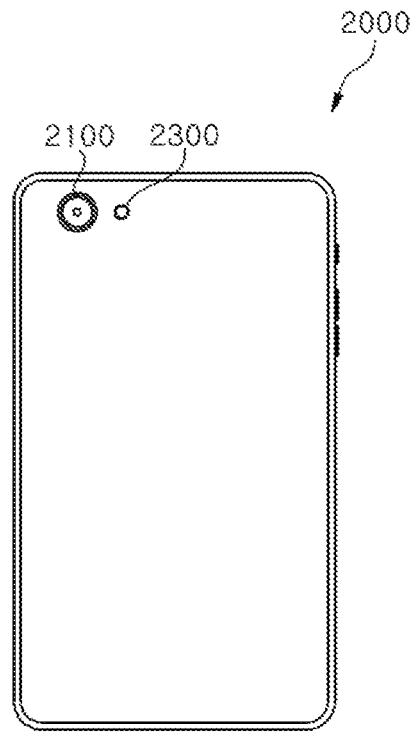
FIG. 35 is a schematic perspective view of a mobile device including a flash module to which light emitting diodes according to exemplary embodiments are applied.

FIG. 35 is a schematic perspective view of a mobile device 2000 including a flash module 2300 to which a light emitting diode according to exemplary embodiments is applied.

Referring to FIG. 35, the mobile device 2000 includes a camera module 2100 and a flash module 2300. The light emitting diode 100, 200, 300, 400, 500, 600, 700, 800, 900, 1000, 1100, 1200, or 1300 according to the exemplary embodiments is provided to the flash module 2300. The flash module 2300 supplies light to an object when the camera module 2100 is operated to photograph the object.

The light emitting diode may be provided to the camera module 2100 in the form of the light source module as described with reference to FIG. 32. However, it should be understood that other implementations are also possible and the light emitting diode may be provided in the form of various shapes of light emitting modules.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode, comprising:
a substrate having a side surface and an upper surface;
a semiconductor stack disposed under the substrate and comprising a first conductivity type semiconductor layer, a second conductivity type semiconductor layer, and an active layer interposed between the first conductivity type semiconductor layer and the second conductivity type semiconductor layer;
an ohmic reflection layer electrically connected to the second conductivity type semiconductor layer;
a first bump pad disposed under the ohmic reflection layer and electrically connected to the first conductivity type semiconductor layer;
a second bump pad disposed under the ohmic reflection layer and electrically connected to the second conductivity type semiconductor layer;
a side reflection layer covering the side surface of the substrate; and
a capping layer covering the upper surface of the substrate and the side reflection layer.

2. The light emitting diode according to claim 1, further comprising:
a light transmitting material layer interposed between the side surface of the substrate and the side reflection layer.

3. The light emitting diode according to claim 2, wherein the substrate comprises four side surfaces, and the light transmitting material layer and the side reflection layer cover the four side surfaces of the substrate.

4. The light emitting diode according to claim 2, wherein the light transmitting material layer comprises at least one material selected from the group consisting of ITO, ZnO, $SiN_x$, SiON, and $SiO_2$.

5. The light emitting diode according to claim 2, wherein a lower end of the light transmitting material layer is flush with a lower end of the side reflection layer.

6. The light emitting diode according to claim 1, wherein the side reflection layer comprises a reflective metal layer and a barrier layer.

7. The light emitting diode according to claim 6, wherein an upper end of the reflective metal layer and an upper end of the barrier layer are disposed outside the upper surface of the substrate.

8. The light emitting diode according to claim 7, wherein the upper end of the barrier layer is placed higher than the upper end of the reflective metal layer.

9. The light emitting diode according to claim 1, wherein:
the substrate comprises a perpendicular side surface perpendicular with respect to an upper surface of the first conductivity type semiconductor layer and an inclined side surface inclined with respect to the perpendicular side surface, and
the inclined side surface is further from the upper surface of the substrate than the perpendicular side surface.

10. The light emitting diode according to claim 9, wherein the inclined side surface is formed by scribing and the perpendicular side surface is formed by breaking.

11. The light emitting diode according to claim 1, wherein the capping layer comprises at least one material selected from the group consisting of $SiO_2$, $SiN_x$, SiON, ITO, a primer, and spin-on-glass (SOG).

12. The light emitting diode according to claim 1, wherein:
the light emitting diode comprises a mesa disposed on the first conductivity type semiconductor layer,
the mesa comprises the active layer and the second conductivity type semiconductor layer,
the mesa is separated from the side surface of the substrate, and
the side reflection layer is separated from the mesa in a lateral direction.

13. The light emitting diode according to claim 12, further comprising:
a lower insulation layer covering the ohmic reflection layer, the lower insulation layer comprising a first opening exposing the first conductivity type semiconductor layer and a second opening exposing the ohmic reflection layer;
a first pad metal layer disposed on the lower insulation layer and electrically connected to the first conductivity type semiconductor layer through the first opening;
a second pad metal layer disposed on the lower insulation layer and electrically connected to the ohmic reflection layer through the second opening; and
an upper insulation layer covering the first pad metal layer and the second pad metal layer, the upper insulation layer comprising a first opening exposing the first pad metal layer and a second opening exposing the second pad metal layer,
wherein the first bump pad is disposed on and electrically connected to the first pad metal layer through the first opening of the upper insulation layer, and
wherein the second bump pad is disposed on is electrically connected to the second pad metal layer through the second opening of the upper insulation layer.

14. The light emitting diode according to claim 13, wherein the mesa comprises a through-hole formed through the second conductivity type semiconductor layer and the active layer to expose the first conductivity type semiconductor layer, and the first pad metal layer is electrically connected to the first conductivity type semiconductor layer exposed through the through-hole.

15. The light emitting diode according to claim 14, wherein the mesa further comprises an indented portion formed on side surfaces of the mesa in plan view to expose the first conductivity type semiconductor layer, and the first pad metal layer is electrically connected to the first conductivity type semiconductor layer exposed through the indented portion.

16. The light emitting diode according to claim 15, wherein the mesa has corners each having a cut shape and the first pad metal layer is electrically connected to the first conductivity type semiconductor layer at the corners of the mesa in plan view.

17. The light emitting diode according to claim 1, further comprising an ohmic oxide layer disposed around the ohmic reflection layer and forming ohmic contact with the second conductivity type semiconductor layer.

18. The light emitting diode according to claim 1, further comprising a wavelength converter disposed on the substrate.

19. The light emitting diode according to claim 18, wherein the wavelength converter comprises at least one wavelength converter selected from the group consisting of wavelength converting sheet and a ceramic plate phosphor.

20. The light emitting diode according to claim 18, wherein the wavelength converter is bonded to the capping layer via a bonding agent.

\* \* \* \* \*